(12) United States Patent
Vasilache et al.

(10) Patent No.: US 7,587,314 B2
(45) Date of Patent: Sep. 8, 2009

(54) SINGLE-CODEBOOK VECTOR QUANTIZATION FOR MULTIPLE-RATE APPLICATIONS

(75) Inventors: Adriana Vasilache, Tampere (FI); Anssi Rämö, Tampere (FI)

(73) Assignee: Nokia Corporation, Espoo (FI)

( * ) Notice: Subject to any disclaimer, the term of this patent is extended or adjusted under 35 U.S.C. 154(b) by 523 days.

(21) Appl. No.: 11/214,484

(22) Filed: Aug. 29, 2005

(65) Prior Publication Data

US 2007/0055509 A1    Mar. 8, 2007

(51) Int. Cl.
G10L 19/12    (2006.01)
G10L 15/06    (2006.01)
G10L 19/00    (2006.01)
G10L 21/04    (2006.01)
G06K 9/00     (2006.01)
G06K 9/46     (2006.01)
H04N 7/12     (2006.01)

(52) U.S. Cl. .................. 704/222; 704/219; 704/243; 704/500; 704/501; 704/503; 382/253; 382/243; 375/240.22

(58) Field of Classification Search .............. 704/219, 704/222, 243, 500–503; 382/253, 243; 370/240.22
See application file for complete search history.

(56) References Cited

U.S. PATENT DOCUMENTS

| | | | | |
|---|---|---|---|---|
| 5,151,968 A * | 9/1992 | Tanaka et al. | ................ | 704/222 |
| 5,619,717 A * | 4/1997 | Staats | .......................... | 712/36 |
| 5,734,791 A * | 3/1998 | Acero et al. | ................ | 704/222 |
| 6,269,333 B1 * | 7/2001 | Ravishankar | ............... | 704/243 |
| 6,349,152 B1 * | 2/2002 | Chaddha | ..................... | 382/253 |
| 6,504,877 B1 * | 1/2003 | Lee | ............................ | 375/265 |
| 6,952,671 B1 * | 10/2005 | Kolesnik et al. | ............ | 704/222 |
| 2005/0285764 A1 * | 12/2005 | Bessette et al. | ............. | 341/143 |

(Continued)

FOREIGN PATENT DOCUMENTS

GB    2300548 A  * 11/1996

(Continued)

OTHER PUBLICATIONS

Ramakrishnan, S.; Rose, K.; Gersho, A., "Constrained-storage vector quantization with a universal codebook ," Image Processing, IEEE Transactions on , vol. 7, No. 6, pp. 785-793, Jun. 1998.*

(Continued)

*Primary Examiner*—David R Hudspeth
*Assistant Examiner*—Paras Shah

(57) ABSTRACT

This invention relates to a method, a device and a software application product for N-level quantization of vectors, wherein N is selectable prior to said quantization from a set of at least two pre-defined values that are smaller than or equal to a pre-defined maximum number of levels M. A reproduction vector for each vector is selected from an N-level codebook of N reproduction vectors that are, for each N in said set of at least two pre-defined values, represented by the first N reproduction vectors of the same joint codebook of M reproduction vectors. The invention further relates to a method, a device and a software application product for retrieving reproduction vectors for vectors that have been N-level quantized, to a system for transferring representations of vectors, to a method, a device and a software application product for determining a joint codebook, and to such a joint codebook itself.

42 Claims, 9 Drawing Sheets

U.S. PATENT DOCUMENTS

| | | | |
|---|---|---|---|
| 2006/0080090 A1* | 4/2006 | Ramo et al. | 704/222 |
| 2007/0094019 A1* | 4/2007 | Nurminen | 704/222 |
| 2007/0162236 A1* | 7/2007 | Lamblin et al. | 702/20 |
| 2009/0037172 A1* | 2/2009 | Fodrini et al. | 704/243 |
| 2009/0074076 A1* | 3/2009 | Li et al. | 375/240.22 |

FOREIGN PATENT DOCUMENTS

| | | |
|---|---|---|
| WO | 2004/015689 | 2/2004 |
| WO | 2005/083889 | 9/2005 |

OTHER PUBLICATIONS

Bhattacharya, B.; LeBlanc, W.; Mahmoud, S.; Cuperman, V., "Tree searched multi-stage vector quantization of LPC parameters for 4 kb/s speech coding," Acoustics, Speech, and Signal Processing, 1992. ICASSP-92., 1992 IEEE International Conference on , vol. 1, No., pp. 105-108 vol. 1, Mar. 23-26, 1992.*

Khan, M.A.U.; Smith, M.J.T.; McLaughlin, S.W., "Jointly optimized trellis-coded residual vector quantization," Communications, IEEE Transactions on , vol. 49, No. 6, pp. 937-942, Jun. 2001.*

"Low-Complexity Multi-Rate Lattice Vector Quantization with Application to Wideband TCX Speech Coding at 32 KBIT/S" by Stephane Ragot, et al; Acoustics, Speech, and Signal Processing, 2004. Proceedings. (ICASSP '04). IEEE International Conference on Montreal, Quebec, Canada, May 17-21, 2004, Piscataway, NJ, IEEE, vol. 1, May 17, 2004, pp. 501-504, XP010717675.

"Least Squares Quantization in PCM", S. Lloyd, IEEE Transactions of Information Theory, vol. IT-28, No. 2, Mar. 1982, pp. 129-137.

"Embedded Algebraic Vector Quantizers (EAVQ) With Application to Wideband Speech Coding", Xie et al., Department of Electrical and Computer Engineering, University of Sherbrooke, Quebec, Canada, IEEE, 0-7803-3192-3/96, pp. 240-243, 1996.

"Low-Complexity Multi-Rate Lattice Vector Quantization with Application to Wideband TCX Speech Coding at 32 KBIT/S", Ragot et al., University of Sherbrooke, Quebec, Canada, IEEE, 0-7803-8484-9/04, 2004, pp. I-501-I-505.

"An Algorithm for Vector Quantizer Design", Linde et al., IEEE Transactions on Communications, vol. CM-28, No. 1, Jan. 1980.

"Embedded Coding of Speech: A Vector Quantization Approach", Haoul et al., Department of Electrical Engineering and Computer Science, University of California, Berkeley, California, IEEE CH2118-8/85/0000-1703, 1985, pp. 1703-1706.

* cited by examiner

SINGLE-CODEBOOK VECTOR QUANTIZATION FOR MULTIPLE-RATE APPLICATIONS

FIELD OF THE INVENTION

This invention relates to a method, a device and a software application product for N-level quantization of vectors, wherein N can be selected prior to said quantization from a set of at least two pre-defined values that are smaller than or equal to a pre-defined maximum number of levels M. The invention further relates to a method, a device and a computer program product for retrieving reproduction vectors for vectors that have been N-level quantized, to a system for transferring representations of vectors, to a method, a device and a software application product for determining a codebook to be used in such a quantization, and to such a codebook itself.

BACKGROUND OF THE INVENTION

Speech and audio coding algorithms have a wide variety of applications in communication, multimedia and storage systems. The development of such coding algorithms is driven by the need to save transmission and storage capacity while maintaining high quality of the coded signal. The complexity of the encoder is limited by the processing power of the application platform. In some applications, e.g. voice storage, the encoder may be highly complex, while the decoder should be as simple as possible.

In a typical speech encoder, an input speech signal is processed in segments, which are called frames. Usually the frame length is 10-30 ms, and a look ahead segment of 5-15 ms of the subsequent frame is also available. The frame may further be divided into a number of sub-frames. For every frame, the encoder determines a parametric representation of the input signal, for instance by Linear Predictive Coding (LPC). The obtained parameters are quantized and transmitted through a communication channel, or stored in a storage medium in a digital form. At the receiving end, the decoder constructs a synthesized signal based on the received parameters.

Therein, the LPC coefficients (or the corresponding Line Spectrum Frequencies (LSFs)) obtained by LPC are nowadays usually quantized with Vector Quantization (VQ) by stacking the LPC/LSF coefficients into a vector. Similarly, also the parameters related to the excitation signal (e.g. gain, pitch or voicing parameters) of several subsequent frames or sub-frames may be quantized by VQ.

VQ is a lossy data compression method based on the principle of block coding. In N-level VQ, vectors are quantized by selecting, from a codebook containing N reproduction vectors (the so-called codewords), the reproduction vectors that cause the smallest distortion with respect to the vectors (said distortion being determined by an appropriate distortion measure, as for instance the Euclidean distance or the squared Euclidean distance, to name but a few). These selected reproduction vectors can be uniquely identified by respective identifiers. If the quantized vectors are to be transmitted via a transmission channel, and if the codebook is known at a receiving site, it may then be sufficient to exchange only the identifiers between the quantizer at the transmitting site and a unit at the receiving site that is to retrieve the reproduction vector selected for a vector at the transmitting site. This unit then simply retrieves the reproduction vector identified by the identifier from the codebook. Frequently, N is chosen to be a power of 2, and then binary words of word length $n=\log_2(N)$ can be used as identifiers for the reproduction vectors. The word length n then is proportional to the output bit rate of the quantizer. With increasing word length n, the number of levels $N=2^n$ and thus the resolution of the quantizer increases, but also the output bit rate of the quantizer increases.

The quantization of the parameters requires codebooks, which contain reproduction vectors optimized for the quantization task. In the earlier days, the design of codebooks for VQ was considered to be a challenging task due to the need for multi-dimensional integration. In 1980, Linde, Buzo, and Gray (LBG) proposed the so-called LBG algorithm for generating codebooks based on a training sequence of vectors (see Linde, Y., Buzo, A. and Gray, R. M., "An algorithm for Vector Quantization", IEEE Transactions on Communications, vol. 28, No. 1, Jan. 1980). The use of a training sequence of vectors bypasses the need for multi-dimensional integration. The LBG algorithm can be considered as a multi-dimensional generalization of the classic Lloyd algorithm that is suited for the construction of codebooks for scalar quantization.

The LBG algorithm produces a codebook for a desired number of levels N. If in the same codec, several numbers of levels N have to be supported, then for each number of levels N, a respective codebook has to be trained, and stored at both the quantizer and a unit that is used to retrieve the reproduction vectors from identifiers of the reproduction vectors. Such a need for several numbers of levels N may for instance arise in coding scenarios where transmission to terminals with different storage and processing capabilities is involved, or where the transmission channel characteristics are time-variant, or where the totally available bit rate is dynamically allocated between source and channel coding, to name but a few. The storage of respective codebooks for several different numbers of levels N disadvantageously increases the memory requirements of both the quantizer and a unit for retrieving reproduction vectors of vectors that have been quantized, thus increasing size and costs. Furthermore, the structure of the quantizer and the reproduction vector retrieving unit becomes cramped, because access to several codebooks has to be controlled.

Prior art document Haoui, A. and Messerschmitt, D. G.: "Embedded Coding of Speech: A Vector Quantization Approach", Proceedings IEEE International Conference on Acoustics, Speech and Signal Processing (ICASSP), Apr. 1985, vol. 10, pp. 1703-1706, is related to embedded speech coders. An embedded speech coder is a source coder with the property that the fidelity of its reproduction of the input signal degrades gracefully as the bit rate is decreased in steps from a maximum rate to a minimum rate. Therein, the encoder does not know the actual bit rate being transmitted, and only knows the order in which bits will be discarded (for instance, the transmitted bit stream might be byte oriented, with the bits discarded in order from least to most significant). A codebook is designed for the maximum rate, and quantization is always performed for a fixed number of levels that corresponds to this maximum rate, irrespective of the number of bits that will be discarded during transmission (and thus affect the actual bit rate). To account for the discarding of bits, it is for instance proposed to assign two binary words that only differ in the least significant bit to two codewords which are close to each other in Euclidean distance so that replacing the least significant bit by zero will lead to a small increase in the error.

Prior art document Ragot, S., Bessette, B. and Lefebvre, R.: "Low-Complexity Multi-Rate Lattice Vector Quantization with Application to Wideband TCX Speech Coding at 32 kbit/s", Proceedings IEEE International Conference on Acoustics, Speech and Signal Processing (ICASSP), 2004, vol. 1, pp. 501-504, is related to multi-rate lattice vector quantization. Therein, an 8-dimensional vector is encoded into one of 6 codebooks, which respectively form shells of an integer lattice $RE_8$. Lattice VQ is self-scalable, i.e. the choice of the codebook, and thus the word length n, depends on the vector to be quantized and can thus not be selected prior to quantization. The codevectors are algebraically constructed and thus do not either have to be trained or stored. The flexibility of lattice VQ is generally restricted by the fact that each codebook is composed of several shells of the lattice whose cardinality depends on the lattice. By combining together several shells, the size of the codebooks can for instance be made a power of 2 or also other numbers, but not any desired number.

SUMMARY OF THE INVENTION

In view of the above-mentioned problems, it is, inter alia, an object of the present invention to provide an improved method, device and software application product for N-level quantization of vectors with different selectable numbers of levels N.

It is a further object of the present invention to provide an improved method, device and software application product for retrieving reproduction vectors for vectors that have been N-level quantized with different selectable numbers of levels N.

It is a further object of the present invention to provide an improved system for transferring representations of vectors.

It is a further object of the present invention to provide an improved method, device and software application product for determining a codebook for use in an N-level quantization of vectors with different selectable numbers of levels N.

It is a further object of the present invention to provide an improved codebook for use in an N-level quantization of vectors with different selectable numbers of levels N.

First Aspect of the Invention

According to a first aspect of the present invention, a method for N-level quantization of vectors is proposed, wherein N is selectable prior to said quantization from a set of at least two pre-defined values that are smaller than or equal to a pre-defined maximum number of levels M. Said method comprises selecting a reproduction vector for each vector from an N-level codebook of N reproduction vectors that are, for each N in said set of at least two pre-defined values, represented by the first N reproduction vectors of the same joint codebook of M reproduction vectors.

Therein, said vectors and said reproduction vectors are k-dimensional vectors with k being larger than or equal to 1, so that both cases of scalar and vector quantization may be targeted. Said vectors contain data that is to be quantized. Said data contained in each vector may for instance be a parameter set, as for instance a set of LPC/LSF coefficients of a frame or sub-frame of a speech or audio signal or a set of gain, pitch or voicing parameters of one or more subsequent frames or sub-frames.

Said vectors are N-level quantized by selecting a reproduction vector from an N-level codebook. Said selection may for instance be governed by a distortion criterion that quantifies the distortion (e.g. the Euclidean distance or squared Euclidean distance, or other criteria) between the vector and the reproduction vector, and then the reproduction vector which minimizes said distortion criterion is selected. An identifier of said selected reproduction vector then is output as a result of the quantization and allows a reproduction vector retrieving unit, given the fact that this unit knows said codebook, to retrieve the selected reproduction vector. Therein, the distortion between said vector and the selected reproduction vector generally decreases with increasing number of levels N, since with increasing N, the N-level codebook contains more reproduction vectors and thus is able to cover the vector space in which said vector is contained in a better way. However, with increasing number of N, also generally the storage and/or transmission of said identifiers grows more complex.

Therein, said number of levels N is selectable prior to said quantization (in contrast to prior art self-scalable lattice vector quantization, where quantization is self-scalable and determines the best-suited number of levels during quantization based on the current vector to be quantized) from a set of at least two pre-defined values that are smaller than or equal to a pre-defined maximum number of levels M (in contrast to prior art embedded coding, where quantization is always performed with a fixed number of levels corresponding to the maximum bit rate). For instance, M may be 256, and said set of pre-defined values from which said number of levels N can be selected may be defined as $\{2,4,8,16,32,64,128,256\}$.

However, M and/or N do not necessarily have to be powers of 2, since in some quantization applications, it may be more efficient to use codebooks that comprise a number of reproduction vectors that is not a power of 2, for example if, as an identifier of said selected reproduction vector, not a binary word of length $n=\log_2(N)$ is used. M may then for instance be any desired integer number, and N may then be any desired number with $1 \leq N \leq M$.

Said selection of said number of levels N may for instance be performed by an instance that is external with respect to said quantizer. Said selection of said number of levels N may for instance be performed in dependence on the transmission characteristics of a transmission channel via which information on said quantized vectors has to be transmitted, or in dependence on the storage capacity of a storage unit in which information on said quantized vectors has to be stored, to name but a few possibilities.

According to this first aspect of the present invention, quantization of vectors is performed for different numbers of levels N based on the same joint codebook. This joint codebook contains all the N-level codebooks required for the quantizations with different number of levels $N \leq M$. For each N, said N-level codebooks are represented by the respective first N reproduction vectors of the joint codebook. For instance, if M=256, and if said pre-defined set of at least two values for N is $\{128,256\}$, in case of N=128, the first 128 reproduction vectors in said codebook of M=256 reproduction vectors form the codebook for 128-level quantization, and in case of N=256, the first 256 reproduction vectors in said same codebook of M=256 reproduction vectors form the codebook for 256-level quantization. It is readily clear for the person skilled in the art that equally well, said N-level codebook could be positioned at the end of the joint codebook, if it was more appropriate.

In contrast to prior art, where one respective codebook has to be constructed and stored for each desired number of levels N, according to the present invention, only one joint codebook has to be constructed and stored. For instance, if the maximum number of levels M is defined to be 256, according to the present invention only one codebook with 256 reproduction vectors has to be constructed and stored, since it also comprises the codebook for smaller numbers of levels N, for instance for N=128, whereas in prior art, two codebooks (with 256 and 128 reproduction vectors) would have to be constructed and stored. This vastly contributes to reduce storage requirements of both the quantizer and a unit that retrieves reproduction vectors of vectors that have been N-level quantized, and also simplifies the structure of the quantizer and such a unit, because only access to one codebook has to be controlled. The use of a joint codebook for different numbers of levels N becomes possible by accordingly constructing the joint codebook. Generally, the number N of reproduction vectors in each N-level codebook contained in the joint codebook according to the present invention can be flexibly chosen and is, in particular, not restricted by the cardinality of lattice shells as it is the case in prior art lattice VQ. Thus the joint codebook according to the present invention allows for a particularly flexible choice of the number of quantization levels. An additional degree of flexibility is provided by the possibility to select the dimension of said vector, so that both the case of scalar quantization and of vector quantization can be addressed.

In the method according to the first aspect of the present invention, $N=2^n$ and $M=2^m$ may hold, with n and m being integer values. Constraining M and N to be powers of two may be particularly advantageous if binary words of word length n shall be used as identifiers of the selected reproduction vectors, since a binary word of length i allows to index $2^i$ different reproduction vectors.

In the method according to the first aspect of the present invention, each of said reproduction vectors in said N-level codebook may be identified by an n-bit binary word. In case of $N=2^n$, said binary word may then efficiently index all $N=2^n$ reproduction vectors in said N-level codebook.

In the method according to the first aspect of the present invention, said vectors may comprise parameters related to Linear Predictive Coding of a data sequence. Said parameters may for instance be LPC/LSF coefficients characterizing a vocal tract during one or several frames or sub-frames of a speech audio signal, and/or parameters related to an excitation signal (such as gain, pitch and/or voicing) in one or several subsequent frames or sub-frames of said speech or audio signal.

In the method according to the first aspect of the present invention, said step of selecting may be performed by a portable communication device. Said portable communication device may for instance be a mobile phone, a Personal Digital Assistant (PDA), a portable computer or the like. Equally well, said step may of course be performed by an immobile communication device, as for instance a base station or core network element of a communication system.

According to the first aspect of the present invention, furthermore a device for N-level quantization of vectors is proposed, wherein N is selectable prior to said quantization from a set of at least two pre-defined values that are smaller than or equal to a pre-defined maximum number of levels M. Said device comprises means for selecting a reproduction vector for each vector from an N-level codebook of N reproduction vectors that are, for each N in said set of at least two pre-defined values, represented by the first N reproduction vectors of the same joint codebook of M reproduction vectors.

For this device according to the first aspect of the present invention, the same characteristics and advantages as already discussed in the context of the method according to the first aspect of the present invention apply.

Said device according to the first aspect of the present invention may be a portable communication device. Said portable communication device may for instance be a mobile phone, a Personal Digital Assistant (PDA), a portable computer or the like. Equally well, said device may of course be an immobile communication device, as for instance a base station or core network element of a communication system.

According to the first aspect of the present invention, furthermore a software application product is proposed, comprising a storage medium having a software application for N-level quantization of vectors embodied therein, wherein N is selectable prior to said quantization from a set of at least two pre-defined values that are smaller than or equal to a pre-defined maximum number of levels M. Said software application comprises program code for selecting a reproduction vector for each vector from an N-level codebook of N reproduction vectors that are, for each N in said set of at least two pre-defined values, represented by the first N reproduction vectors of the same joint codebook of M reproduction vectors.

Said storage medium may be any volatile or non-volatile memory or storage element, such as for instance a Read-Only Memory (ROM), Random Access Memory (RAM), a memory stick or card, and an optically, electrically or magnetically readable disc. Said program code comprised in said software application may be implemented in a high level procedural or object oriented programming language to communicate with a computer system, or in assembly or machine language to communicate with a digital processor. In any case, said program code may be a compiled or interpreted code.

For this software application product according to the first aspect of the present invention, the same characteristics and advantages as already discussed in the context of the method according to the first aspect of the present invention apply.

Second Aspect of the Invention

According to a second aspect of the present invention, a method for retrieving reproduction vectors for vectors that have been N-level quantized is proposed, wherein N is selectable prior to a quantization of said vectors from a set of at least two pre-defined values that are smaller than or equal to a pre-defined maximum number of levels M. Said method comprises receiving an identifier of a reproduction vector that has been selected for a vector in said quantization; and retrieving, based on said identifier, said reproduction vector from an N-level codebook of N reproduction vectors that are, for each N in said set of at least two pre-defined values, represented by the first N reproduction vectors of the same joint codebook of M reproduction vectors.

Therein, it should be noted that the description of the vectors and the reproduction vectors, of the selection of the number of levels N and of the selection of the reproduction vector for each vector presented in the context of the first aspect of the present invention also applies to the second aspect of the present invention.

Said vectors have been quantized by selecting a reproduction vector from an N-level codebook according to a distortion criterion, for instance as described in the context of the first aspect of the present invention. This reproduction vector is identified by an identifier, which may for instance be an n-bit binary word, and which may for instance be transmitted via a transmission channel to a device that performs the method according to the second aspect of the present invention. Upon reception of said identifier, and based on said identifier, the corresponding reproduction vector is retrieved from said N-level codebook that is represented by the first N reproduction vectors of said joint codebook. The fact that for all N that are selectable for said quantization, the corresponding N-level codebooks are contained in said joint codebook vastly reduces the storage capacity that is required at a unit that performs the method according to the second aspect of the present invention. Furthermore, operation of this unit is simplified, since only access to one single codebook (the joint codebook), and not to a plurality of codebooks, is required.

According to the second aspect of the present invention, furthermore a device for retrieving reproduction vectors for vectors that have been N-level quantized is proposed, wherein N is selectable prior to a quantization of said vectors from a set of at least two pre-defined values that are smaller than or equal to a pre-defined maximum number of levels M. Said device comprises means for receiving an identifier of a reproduction vector that has been selected for a vector in said quantization; and means for retrieving, based on said identifier, said reproduction vector from an N-level codebook of N reproduction vectors that are, for each N in said set of at least two pre-defined values, represented by the first N reproduction vectors of the same joint codebook of M reproduction vectors.

According to the second aspect of the present invention, furthermore a software application product is proposed, comprising a storage medium having a software application for retrieving reproduction vectors for vectors that have been N-level quantized embodied therein, wherein N is selectable prior to a quantization of said vectors from a set of at least two pre-defined values that are smaller than or equal to a pre-defined maximum number of levels M. Said software application comprises program code for receiving an identifier of a reproduction vector that has been selected for a vector in said quantization; and program code for retrieving, based on said identifier, said reproduction vector from an N-level codebook of N reproduction vectors that are, for each N in said set of at least two pre-defined values, represented by the first N reproduction vectors of the same joint codebook of M reproduction vectors.

Said storage medium may be any volatile or non-volatile memory or storage element, such as for instance a Read-Only Memory (ROM), Random Access Memory (RAM), a memory stick or card, and an optically, electrically or magnetically readable disc. Said program code comprised in said software application may be implemented in a high level procedural or object oriented programming language to communicate with a computer system, or in assembly or machine language to communicate with a digital processor. In any case, said program code may be a compiled or interpreted code.

Third Aspect of the Invention

According to a third aspect of the present invention, a system for transferring representations of vectors is proposed. The system comprises means for selecting a reproduction vector for each vector from an N-level codebook of N reproduction vectors, wherein N is selectable prior to said selecting from a set of at least two pre-defined values that are smaller than or equal to a pre-defined maximum number of levels M, and wherein said N reproduction vectors are, for each N in said set of at least two pre-defined values, represented by the first N reproduction vectors of a first joint codebook of M reproduction vectors; means for transmitting an identifier of said selected reproduction vector via a transmission channel; means for receiving said identifier; and means for retrieving, based on said identifier, said reproduction vector from an N-level codebook of N reproduction vectors represented by the first N reproduction vectors of a second joint codebook of M reproduction vectors that equals said first joint codebook.

Therein, it should be noted that the description of the vectors and the reproduction vectors, of the selection of the number of levels N and of the selection of the reproduction vector for each vector presented in the context of the first aspect of the present invention also applies to the third aspect of the present invention.

By selecting a reproduction vector for each vector from an N-level codebook that is contained in said first joint codebook, and transmitting an identifier of said reproduction vector only, such as for instance an n-bit binary word with $n=\log_2(N)$, a particularly efficient transfer of a representation of said vector (i.e. said reproduction vector, or its corresponding identifier) is obtained, since the information on the identifier enables a unit that receives said identifier to retrieve said reproduction vector from a corresponding N-level codebook contained in said second joint codebook (that equals said first codebook). Therein, the distortion of the vector, which is caused by the fact that the reproduction vectors stem from a codebook with a limited number of reproduction vectors and thus generally differ from said vector, decreases with increasing N, whereas the word length of the n-bit binary word increases. Thus via N, a trade-off between accuracy and required transmission capacity can be controlled.

Said selection of said reproduction vector (i.e. said quantization of the vector) may for instance take place at a transmitter in a communication network such as a mobile radio system, and said retrieving of said reproduction vector then may be performed at a receiver in said communication network. A transmission channel between said transmitter and said receiver may be a wireless or wired transmission channel. Said transmission channel can also be understood to represent a storage medium onto which said identifier of said reproduction vector is stored at the transmitter site and read at the receiver site. Furthermore, said identifier may be subject to channel encoding or further processing before being transmitted.

Fourth Aspect of the Invention

According to a fourth aspect of the present invention, a method for determining a joint codebook of M reproduction vectors for use in an N-level quantization of vectors is proposed, wherein M is a pre-defined maximum number of levels, wherein N is selectable prior to said quantization from a set of at least two pre-defined values that are smaller than or equal to M, and wherein in said quantization, a reproduction vector for each vector is selected from an N-level codebook of N reproduction vectors that are, for each N in said set of at least two pre-defined values, represented by the first N reproduction vectors of said joint codebook. Said method comprises generating said reproduction vectors by a training algorithm at least partially based on a plurality of training vectors; and arranging said generated reproduction vectors in said joint codebook according to an arrangement algorithm so that for each N, the first N reproduction vectors in said set of M reproduction vectors form a N-level codebook that allows for a small average distortion of said vectors when used in said quantization of said vectors.

Therein, it should be noted that the description of the vectors and the reproduction vectors, of the selection of the number of levels N and of the selection of the reproduction vector for each vector presented in the context of the first aspect of the present invention also applies to the fourth aspect of the present invention.

The joint codebook determined by said method according to the fourth aspect of the present invention then may for instance be stored into a memory of a device that uses a quantizer and/or a unit that retrieves reproduction vectors of vectors that have been N-level quantized. The specific arrangement of the M reproduction vectors in said joint codebook according to said arrangement algorithm allows said joint codebook to be used as a single codebook for the quantization of vectors with different selectable numbers of levels $N \leq M$ and thus contributes to saving memory in both a quantizer and a reproduction vector retrieving unit.

Said training algorithm produces a set of L reproduction vectors at least partially based on said plurality of training vectors, wherein L can be arbitrarily selected. Said training algorithm may for instance be the LBG algorithm or any other type of codebook training algorithm. One form of the LBG algorithm is the LBG algorithm for an unknown distribution of the vectors as proposed in the Linde et al. prior art reference cited in the opening part of this patent specification. In addition to said plurality of training vectors, said algorithm may be provided with one or more reproduction vectors that shall be considered to be fixed during said generation of said set of L reproduction vectors.

Said step of generating said reproduction vectors does not necessarily have to be performed only once to already obtain all M reproduction vectors, it may equally well be performed several times (for instance each time with increasing numbers of reproduction vectors being generated).

Said arrangement algorithm targets that for each N, the first N reproduction vectors in said set of M reproduction vectors form an N-level codebook that allows for a small average distortion of said vectors when used in said N-level quantization of said vectors. Therein, said distortion quantifies a deviation of the vector from the reproduction vector that is selected from said N-level codebook in said quantization of said vector. According to the arrangement algorithm used, different codebooks of M reproduction vectors may be produced. Furthermore, it is readily clear that, with increasing numbers of levels N (i.e. increasing numbers of reproduction vectors in the N-level codebook), the average distortion of said vectors decreases due to the availability of an increased number of reproduction vectors in the N-level codebook. Thus, for instance, an average distortion achievable with a codebook of 64 reproduction vectors may be significantly larger than an average distortion achievable with a codebook of 128 reproduction vectors, but still may be considered small in the context of the codebook of 64 reproduction vectors.

In said method according to the fourth aspect of the present invention, $N=2^n$ and $M=2^m$ may hold, with n and m being integer values. This may be particularly advantageous if binary words of word length n shall be used as identifiers of the selected reproduction vectors, since a binary word of length i allows to index $2^i$ different reproduction vectors and thus represents an efficient means for transferring and storing information on the selected reproduction vectors.

A first embodiment of the method according to the fourth aspect of the present invention comprises generating an initial codebook of M reproduction vectors by said training algorithm; generating a 2-level codebook of 2 reproduction vectors by said training algorithm; selecting those 2 reproduction vectors from said initial codebook that are most similar to said 2 reproduction vectors in said 2-level codebook; copying said 2 selected reproduction vectors from said initial codebook to the first 2 positions in said joint codebook and deleting said 2 selected reproduction vectors from said initial codebook; and repeating, for $1<i\leq m$, the following steps: generating an I-level codebook of $I=2^i$ reproduction vectors by said training algorithm; identifying those I/2 reproduction vectors from said I-level codebook that are most similar to said I/2 reproduction vectors already copied to said joint codebook; for the remaining non-identified I/2 reproduction vectors in said I-level codebook, selecting those I/2 reproduction vectors from said initial codebook that are most similar to said remaining non-identified I/2 reproduction vectors; and copying said I/2 selected reproduction vectors from said initial codebook to the next free positions, in increasing sense in said joint codebook and deleting said I/2 selected reproduction vectors from said initial codebook.

In this first embodiment, in which N and M are assumed to be powers of 2, first all M reproduction vectors (the initial codebook) are generated at once by said training algorithm based on a plurality of training vectors, and then the generated reproduction vectors are sequentially arranged into said joint codebook, wherein said arranging, for each stage i of the algorithm, comprises the generation of codebooks of I reproduction vectors by said training algorithm to allow an orientation at the respective optimum codebook of said stage i. Therein, the similarity of vectors is evaluated by means of a similarity criterion, which may for instance be the Euclidean distance between vectors, or the squared Euclidean distance, to name but a few.

A second embodiment of the method according to the fourth aspect of the present invention comprises generating a 2-level codebook of 2 reproduction vectors by said training algorithm; copying said 2 reproduction vectors from said 2-level codebook to the first 2 positions in said joint codebook; and repeating, for $1<i\leq m$, the following steps: generating an I-level codebook of $I=2^i$ reproduction vectors by said training algorithm, wherein in said training algorithm, the I/2 reproduction vectors already copied to said joint codebook form the first part of a codebook of I reproduction vectors, which serves as an initialization of said I-level codebook generated by said training algorithm, and are assumed fixed throughout said training algorithm; and copying the I/2 last reproduction vectors of said generated I-level codebook to the next free I/2 positions in increasing sense in said joint codebook.

In this second embodiment, in which N and M are assumed to be powers of 2, the reproduction vectors for said joint codebook are not generated at once, but sequentially in blocks of size I/2. Therein, the degrees of freedom of the training algorithm in generating a codebook of I reproduction vectors are constrained by providing the training algorithm with the first I/2 reproduction vectors of said codebook and demanding that these reproduction vectors remain fixed during the generation of the remaining I/2 reproduction vectors. As an alternative to copying the last I/2 reproduction vectors of the generated codebook to the next I/2 free positions in the joint codebook, of course also the entire generated codebook (comprising I reproduction vectors) could be copied to the first I positions in the codebook.

A first alternative of a third embodiment of the method according to the fourth aspect of the present invention comprises generating an initial codebook of M reproduction vectors by said training algorithm based on a plurality of training vectors; selecting, from said initial codebook, the two reproduction vectors that are most different to each other; copying said two selected reproduction vectors from said initial codebook to the first two positions in said joint codebook and deleting said two selected reproduction vectors from said initial codebook; and repeating, while said initial codebook is non-empty, the following steps: selecting that reproduction vector from said initial codebook that is most different with respect to all reproduction vectors already copied to said joint codebook; copying said selected reproduction vector from said initial codebook to the next free position in increasing sense in said joint codebook and deleting said selected reproduction vector from said initial codebook.

A second alternative of the third embodiment of the method according to the fourth aspect of the present invention comprises generating an initial codebook of M reproduction vectors by said training algorithm based on a plurality of training vectors; selecting, from said initial codebook, the reproduction vector that is most similar to all of said training vectors; copying said selected reproduction vector from said initial codebook to the first position in said joint codebook and deleting said selected reproduction vector from said initial codebook; and repeating, while said initial codebook is non-empty, the following steps: selecting the reproduction vector from said initial codebook that is most different with respect to all reproduction vectors already copied to said joint codebook; copying said selected reproduction vector from said initial codebook to the next free position in increasing sense in said joint codebook and deleting said selected reproduction vector from said initial codebook.

In this third embodiment, first all M reproduction vectors (the initial codebook) are generated at once by said training algorithm based on training data, and then the generated reproduction vectors are sequentially arranged into said joint codebook, wherein it is attempted to arrange the reproduction vectors from said initial codebook into said joint codebook with decreasing degree of difference, counted from the beginning of said joint codebook, so that the most different reproduction vectors are positioned at the beginning of the joint codebook. Therein, the difference between vectors is evaluated based on a difference criterion, as for instance the Euclidean distance between the vectors or the squared Euclidean distance, to name but a few. According to the first alternative, the two reproduction vectors in said initial codebook that are most different with respect to each other are copied to the first two positions in said joint codebook, whereas according to the second alternative, the reproduction vector from said initial codebook that is most similar to all training vectors in said plurality of training vectors is copied to the first position in said joint codebook.

In this third embodiment, it may be beneficial to impose some constraints so that very rarely used reproduction vectors do not become the first entries in the joint codebook. This may for instance be accomplished by demanding that the magnitude of the reproduction vector components do not exceed a certain limit, wherein this limit may be small for the reproduction vectors at the beginning of the joint codebook and may be increasing towards the end of the joint codebook.

A fourth embodiment of the method according to the fourth aspect of the present invention comprises generating an initial codebook of M reproduction vectors by said training algorithm; repeating, while said initial codebook is non-empty, the following steps: selecting those 2 reproduction vectors from said initial codebook that are most similar to each other; copying the first of said two selected reproduction vectors from said initial codebook to the next free position, in decreasing sense starting from the last position, in said joint codebook and deleting said first of said two selected reproduction vectors from said initial codebook.

In this fourth embodiment, first all M reproduction vectors (the initial codebook) are generated at once by said training algorithm based on training data, and then the generated reproduction vectors are sequentially arranged into said joint codebook, wherein it is attempted to arrange the reproduction vectors from said initial codebook into said joint codebook with increasing degree of difference to other reproduction vectors, but counting from the end of said joint codebook. Therein, the similarity between vectors is evaluated based on a similarity criterion, as for instance the Euclidean distance between the vectors or the squared Euclidean distance, to name but a few.

In a fifth embodiment of the method according to the fourth aspect of the present invention, said set of at least two pre-defined values for N that are smaller than or equal to M contains K values $N_i$ with i=1, ..., K and $N_{j-1} < N_j \leq M$ with j=2, ..., K. Said method then comprises generating an initial codebook of M reproduction vectors by said training algorithm based on a plurality of training vectors; selecting, from said initial codebook, $N_1$ reproduction vectors so that a distortion of a codebook that contains said selected reproduction vectors with respect to all of said training vectors is minimum; copying said selected reproduction vectors from said initial codebook to said joint codebook and deleting said selected reproduction vectors from said initial codebook; and repeating, for each $N_i$ with $1 < i \leq K$, the following steps: selecting, from said initial codebook, $N_i - N_{i-1}$ reproduction vectors so that a distortion of a codebook that contains the $N_{i-1}$ reproduction vectors already copied to said joint codebook and said selected reproduction vectors with respect to all of said training vectors is minimum; and copying said selected reproduction vectors from said initial codebook to the next free positions in increasing sense in said joint codebook and deleting said selected reproduction vectors from said initial codebook.

In this fifth embodiment, first all M reproduction vectors (the initial codebook) are generated at once by said training algorithm based on training data, and then the generated reproduction vectors are arranged into said joint codebook on a codebook-per-codebook basis. For each of the K codebooks of size $N_i$ (with i=1, ..., K, wherein $N_K$ may for instance be equal to M) that are to be contained in said joint codebook, reproduction vectors are selected from the initial codebook so that the distortion of the codebook, which contains the reproduction vectors already determined in previous stages and said newly selected reproduction vectors, with respect to the training vectors used by the training algorithm is minimum. Therein, $N_K$ may be equal to M or not. The distortion of the codebook may for instance be determined by calculating the sum distortion of each reproduction vector contained in the codebook with respect to all training vectors from the reproduction vector's Voronoi cell and summing the sum distortions of all reproduction vectors in said codebook to arrive at a final value. A reproduction vector's Voronoi cell may be considered as the set of input vectors that, under a given distance, are closer to the considered reproduction vector than to any other reproduction vector from the codebook that contains said considered reproduction vector. Therein, the input vectors are all the possible vectors to be quantized through the given codebook, so that the set of training vectors is usually only a sub-set of the set of input vectors (in the degenerate case of codebook with only one reproduction vector, the Voronoi cell of that single reproduction vector is the entire input space). The distortion is determined by means of a distortion criterion, which may for instance be the Euclidean distance between vectors, or the distance derived from the $l_1$ norm, to name but a few.

According to the fourth aspect of the present invention, furthermore a device for determining a joint codebook of M reproduction vectors for use in an N-level quantization of vectors is proposed, wherein M is a pre-defined maximum number of levels M, wherein N is selectable prior to said quantization from a set of at least two pre-defined values that are smaller than or equal to M, and wherein in said quantization, a reproduction vector for each vector is selected from an N-level codebook of N reproduction vectors that are, for each N in said set of at least two pre-defined values, represented by the first N reproduction vectors of said joint codebook. Said device comprises means for generating said reproduction vectors by a training algorithm at least partially based on a plurality of training vectors; and means for arranging said generated reproduction vectors in said joint codebook according to an arrangement algorithm so that for each N, the first N reproduction vectors in said set of M reproduction vectors form an N-level codebook that allows for a small average distortion of said vectors when used in said quantization of said vectors. Therein, said training algorithm may for instance be an LBG algorithm.

According to the fourth aspect of the present invention, furthermore a software application product is proposed, comprising a storage medium having a software application for determining a joint codebook of M reproduction vectors for use in an N-level quantization of vectors embodied therein, wherein M is a pre-defined maximum number of levels M, wherein N is selectable prior to said quantization from a set of at least two pre-defined values that are smaller than or equal to M, and wherein in said quantization, a reproduction vector for each vector is selected from a N-level codebook of N reproduction vectors that are, for each N in said set of at least two pre-defined values, represented by the first N reproduction vectors of said joint codebook. Said software application comprises program code for generating said reproduction vectors by a training algorithm at least partially based on a plurality of training vectors; and program code for arranging said generated reproduction vectors in said joint codebook according to an arrangement algorithm so that for each N, the first N reproduction vectors in said set of M reproduction vectors form an N-level codebook that allows for a small average distortion of said vectors when used in said quantization of said vectors. Therein, said training algorithm may for instance be an LBG algorithm.

Said storage medium may be any volatile or non-volatile memory or storage element, such as for instance a Read-Only Memory (ROM), Random Access Memory (RAM), a memory stick or card, and an optically, electrically or magnetically readable disc. Said program code comprised in said software application may be implemented in a high level procedural or object oriented programming language to communicate with a computer system, or in assembly or machine language to communicate with a digital processor. In any case, said program code may be a compiled or interpreted code.

Fifth Aspect of the Invention

Finally, according to a fifth aspect of the present invention, a joint codebook for use in an N-level quantization of vectors is proposed, wherein M is a pre-defined maximum number of levels, wherein N is selectable prior to said quantization from a set of at least two pre-defined values that are smaller than or equal to M, and wherein in said quantization, a reproduction vector for each vector is selected from an N-level codebook of N reproduction vectors that are, for each N in said set of at least two pre-defined values, represented by the first N reproduction vectors of said joint codebook of M reproduction vectors. Said joint codebook comprises a set of M reproduction vectors, wherein said reproduction vectors in said set of M reproduction vectors are generated by a training algorithm at least partially based on a plurality of training vectors; and wherein said reproduction vectors are arranged in said set of M reproduction vectors according to an arrangement algorithm so that for each N, the first N reproduction vectors in said set of M reproduction vectors form an N-level codebook that allows for a small average distortion of said vectors when used in said quantization of said vectors.

Therein, it should be noted that the description of the vectors and reproduction vectors, the selection of the number of levels N and the selection of the reproduction vector for each vector presented in the context of the first aspect of the present invention also applies to the fifth aspect of the present invention. Said training algorithm may for instance be the LBG algorithm.

The codebook according to the fifth aspect of the present invention may for instance be stored into a memory of a device that uses a quantizer and/or a unit that retrieves reproduction vectors of vectors that have been N-level quantized. The specific arrangement of the M reproduction vectors in said codebook comprising said set of M reproduction vectors according to said arrangement algorithm allows said codebook to be used as a single codebook for the quantization of vectors with different selectable numbers of levels $N \leq M$ and thus contributes to saving memory in both a quantizer and a reproduction vector retrieving unit.

These and other aspects of the invention will be apparent from and elucidated with reference to the embodiments described hereinafter.

DETAILED DESCRIPTION OF THE INVENTION

The present invention is generally related to the context of N-level quantization of vectors, wherein a reproduction vector from an N-level codebook is selected for said vector. Although quantization can be performed for different selectable numbers of levels N taken from a pre-defined set, the N reproduction vectors of all N-level codebooks are represented by the respective first N reproduction vectors in a single joint codebook that comprises M reproduction vectors, with M marking the maximum selectable number of levels.

Therein, a first aspect of the present invention is directed to the N-level quantization of vectors, a second aspect is directed to the retrieving of reproduction vectors for vectors that have been N-level quantized, a third aspect is directed to the transfer of representations of vectors, a fourth aspect is directed to the determination of a joint codebook providing N-level codebooks for a plurality of different N-level quantizations, and a fifth aspect is directed to such a joint codebook itself.

Figure 1:
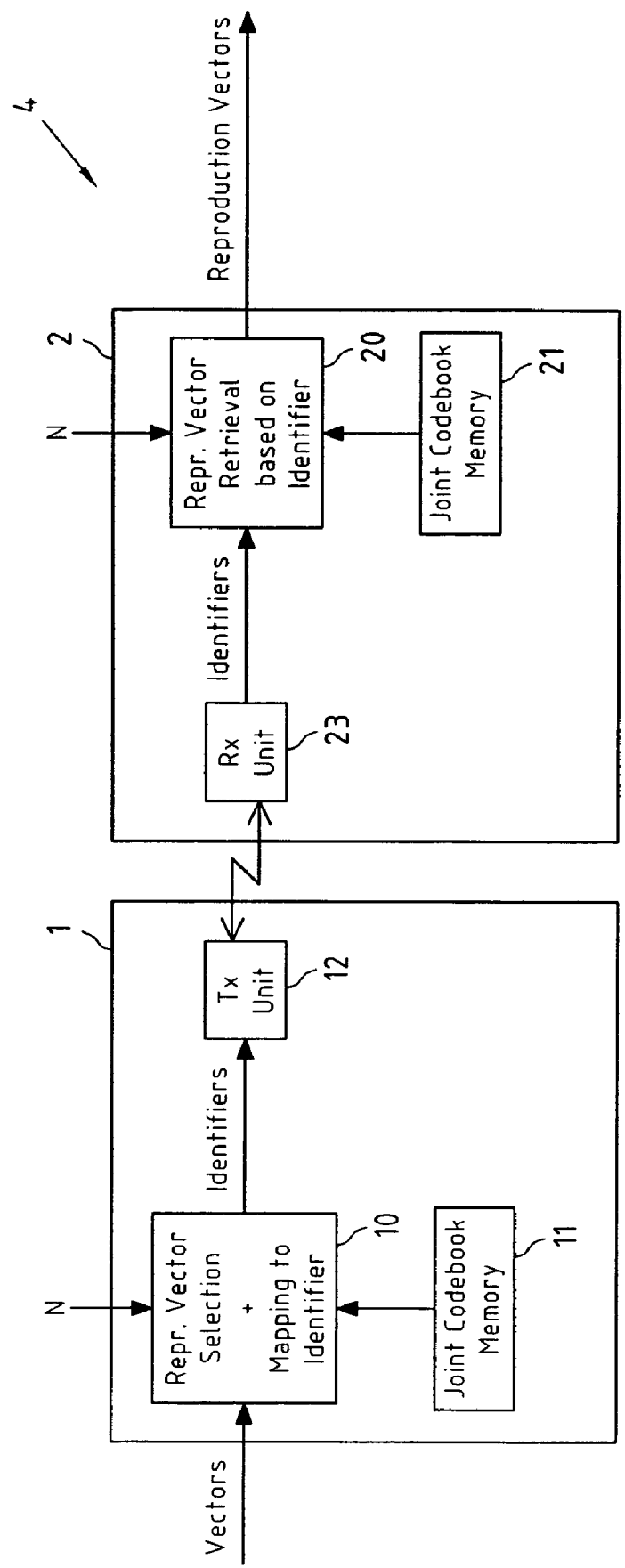
FIG. 1: a schematic presentation of an embodiment of a device for N-level quantization of vectors according to the first aspect of the present invention, and of an embodiment for retrieving reproduction vectors for vectors that have been N-level quantized according to the second aspect of the present invention, comprised in a system for transferring representations of vectors according to a third aspect of the present invention.

FIG. 1 is a schematic presentation of an embodiment of a system 4 for transferring representations of vectors according to the third aspect of the present invention. This system 4 comprises a device 1 for N-level quantization of vectors according to the first aspect of the present invention, and a device 2 for retrieving reproduction vectors of vectors that have been N-level quantized. This system may for instance be contained in a communication system that enables communication between two communication units, wherein a first communication unit then comprises device 1, and a second communication unit then comprises device 2. An example of such a communication system is for instance a mobile radio system, in which speech or audio data is transferred according to a speech or audio codec involving quantization of said speech or audio data.

Device 1 comprises a selection and mapping unit 10, a joint codebook memory 11 and a transmission (Tx) unit 12. Selection and mapping unit 10 is capable of receiving a sequence of k-dimensional vectors, with $k \geq 1$, of selecting, for each of said vectors, a k-dimensional reproduction vector stemming from an N-level codebook, and of mapping the selected reproduction vector to an identifier that uniquely identifies said selected reproduction vector. Said vectors may for instance comprise stacked data related to coding of speech or audio, for instance LPC/LSF coefficients or gain, pitch or voicing parameters of one or several frames or sub-frames of a speech or audio signal. Therein, said parameter N, denoting the number of quantization levels, is fed into said unit 10 from an external unit, for instance from a central controller of a communication unit that comprises device 1.

Said selection of said reproduction vectors is performed based on a distortion criterion, which quantifies a difference between the vector and each reproduction vector. A plurality of distortion criteria is for instance presented in the Linde et al. prior art reference cited in the opening part of this patent specification, e.g. the squared-error distortion or the Holder norm, to name but a few. Generally, selection unit 10 will select a reproduction vector from said N-level codebook that minimizes the applied distortion criterion with respect to the other reproduction vectors contained in said N-level codebook.

Said selection and mapping unit 10 obtains said N-level codebook from joint codebook memory 11, which stores a joint codebook according to the fifth aspect of the present invention. This joint codebook comprises M reproduction vectors, wherein M is a pre-defined value. Said joint codebook may for instance have been stored into said memory 11 during the manufacturing of device 1, for instance if said memory 11 is a ROM. Equally well, said device 1 may comprise an interface via which said joint codebook can be changed or updated from by external unit, as for instance a codebook server. Said memory 11 then may for instance be a RAM.

The joint codebook according to the fifth aspect of the present invention is characterized in that it comprises N-level codebooks for a plurality of pre-defined different values of N, with $N \leq M$. Therein, M defines the maximum number of levels for which device 1 is capable of performing quantization. Thus, according to the present invention, only one single joint codebook has to be stored, while the device is still capable of performing N-level quantization for a plurality of values N. The N-level codebooks required for the N-level quantization are the respective first N reproduction vectors contained in the joint codebook. This property is achieved by appropriately determining the joint codebook, as will be described in more detail below.

Figure 5:
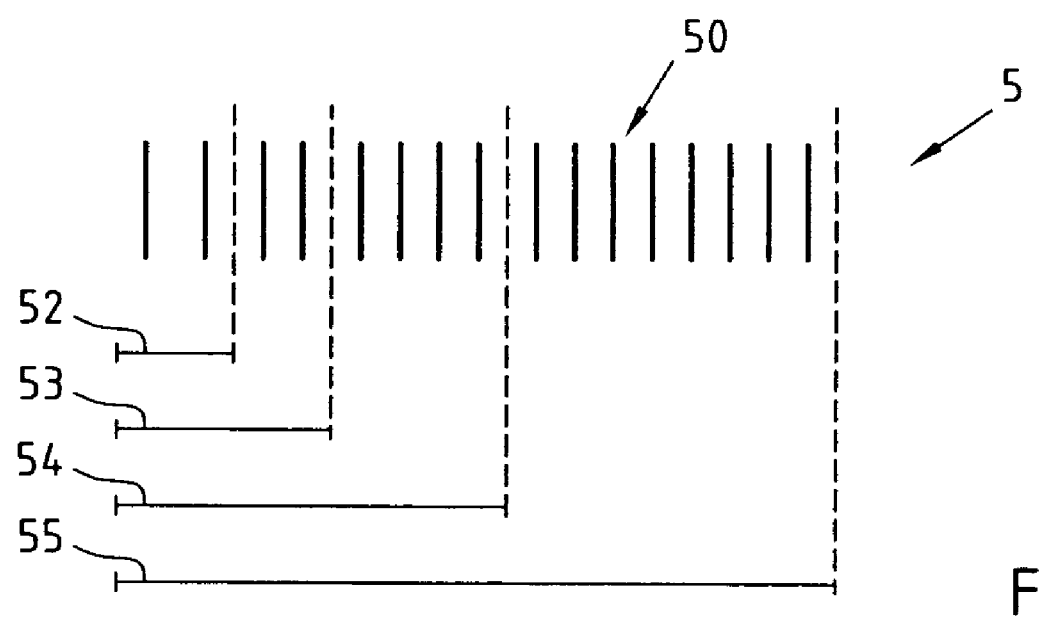
FIG. 5: a schematic presentation of a joint codebook according to the fifth aspect of the present invention.

FIG. 5 depicts an illustrative example of such a joint codebook 5 according to the fifth aspect of the present invention, with M=16 and N being selectable from the set {2,4,8,16}. The joint codebook 5 comprises M=16 k-dimensional reproduction vectors, depicted as horizontal bars. Furthermore, FIG. 5 depicts the association of the reproduction vectors with the joint codebook to the single N-level codebooks by respective range markers 52-55. For instance, the 2-level codebook for N=2 contains only the first two reproduction vectors of the joint codebook, as indicated by range marker 52, the 4-level codebook for N=4 contains only the first four reproduction vectors of the joint codebook, as indicated by range marker 53, and so on. Finally, range marker 55 indicates that, for N=M=16, the 16-level codebook for N=16 comprises all M=16 reproduction vectors of the joint codebook.

For each N-level codebook, the N reproduction vectors contained therein can be mapped to an n-bit binary word, with $n = \log_2(N)$. For instance, for N=4 (i.e. n=2), the first reproduction vector in the 4-level codebook can be identified by the 2-bit binary word '00', the second reproduction vector by the 2-bit binary word '01', the third by reproduction vector by the 2-bit binary word '10' and the fourth reproduction vector by the 2-bit binary word '11'. Thus 2 bits per reproduction vector have to be spent in this case. For N=8 (i.e. n=3), then 3 bits have to be spent, and so on.

To be more explicit, in the following an exemplary joint codebook with M=16 1-dimensional reproduction vectors for use in the quantization of a gain parameter of a speech or audio signal is presented. This example is in line with the joint codebook 5 of FIG. 5. The range of the gain parameter to be quantized is from 0 dB to 96 dB, and the joint codebook shall be suited for 2-level, 4-level, 8-level and 16-level quantization, so that codebooks for N=2, 4, 8 and 16 have to be comprised in the joint codebook. Assuming the gain parameter to be uniformly distributed in the interval 0 dB to 96 dB, a suitable joint codebook is given as (all reproduction vectors in dB):

[24,72,0,48,12,36,60,84,6,18,30,42,54,66,78,90], so that the N-level codebooks contained therein follow as (with all reproduction vectors given in dB):
N=2: [24,72]
N=4: [24,72,0,48]
N=8: [24,72,0,48,12,36,60,84]
N=16:
[24,72,0,48,12,36,60,84,6,18,30,42,54,66,78,90].

It can be readily seen that for each N, the codebooks contain reproduction vectors that attempt to uniformly cover the range from 0 dB to 96 dB as well as possible, wherein with each increase of N, the Euclidean distance between reproduction vectors decreases. For instance, for N=2, this distance is 48 dB, for N=4, this distance is 24 dB, for N=8, this distance is 12 dB, and for N=16, this distance is only 6 dB. Thus each increase in N by two halves this distance.

Now consider the exemplary case that a realization of the gain parameter shall be quantized, said realization being equal to 40 dB. If only n=1 bit (N=2) shall be used for quantization, and if the Euclidean distance is chosen as the distortion criterion, the first reproduction vector in the 2-level codebook, i.e. 24 dB, will be selected. Thus the distortion caused by this reproduction vector is 40−24 dB=16 dB. By spending one more bit, i.e. n=2 (N=4), the best reproduction vector in the 4-level codebook is 48 dB, and correspondingly, the distortion is only 8 dB. For n=3 bits per reproduction vector (N=8), the best reproduction vector is 36 dB, thus decreasing the distortion down to 4 dB. Finally, for n=4 bits per reproduction vector (N=16), the best reproduction vector in the 16-level codebook is 42 dB, thus further decreasing the distortion to 2 dB.

It is thus readily clear that by selecting N, distortion can be traded against required transmission/storage capacity.

Returning to FIG. 1, the above-described selection of reproduction vectors for each vector to be N-level quantized and the mapping of selected reproduction vectors to binary values of word length n=log$_2$(N) is performed by selection and mapping unit 10 of device 1. The identifiers obtained in this way are then forwarded to Tx unit 12, which performs further processing to allow the identifier to be transmitted via a transmission channel. This processing may for instance comprise channel coding, interleaving, baseband modulation and/or RF processing. Said transmission channel can equally well be understood as a storage medium onto which said identifier is stored. In this case, Tx unit 12 then performs processing to allow the storage of the identifier on such a storage medium.

Device 2 in system 4 of FIG. 1 comprises a Reception (Rx) unit 23, a unit 20 for the retrieval of reproduction vectors for vectors that have been N-level quantized in device 1, and a joint codebook memory 21. Therein, the joint codebook stored in memory 21 is the same as the joint codebook stored in memory 11 of device 1. Rx unit 23 receives identifiers transmitted by the Tx unit 12 of device 1 by, for instance, performing RF processing, synchronization, equalization, demodulation, de-interleaving and/or channel decoding. If said transmission channel represents a storage medium, Rx unit 23 performs processing to read the identifiers from this storage medium. Received identifiers are then forwarded to unit 20, which, based on the received identifiers, the parameter N and the joint codebook stored in memory 21, retrieves the reproduction vector that corresponds to the received identifier. This requires that the mapping of reproduction vectors to identifiers is the same for both device 1 and device 2. Furthermore, the parameter N has to be input into unit 20, to enable unit 20 to extract the correct N-level codebook from the joint codebook. N may for instance be made available to unit 20 by an external unit, as for instance a central controller of a communication unit that houses device 2. The retrieved reproduction vector can then be output by device 2 to further processing stages.

System 4 according to the third aspect of the present invention thus allows for a transfer of representations of vectors via a transmission channel. It is readily understood that the reproduction vector retrieved at device 2 is generally not a distortion-free representation of the vector that is quantized at device 1, since the N-level codebooks available for quantization only contain a limited number of reproduction vectors to choose from. With increasing N, the distortion can be reduced, but the number of bits that have to be spent to identify the reproduction vectors correspondingly increases. Thus by the parameter N, distortion may be traded against transmission bandwidth requirements (or storage requirements, if said transmission channel is represented by a data carrier).

Figure 2A:
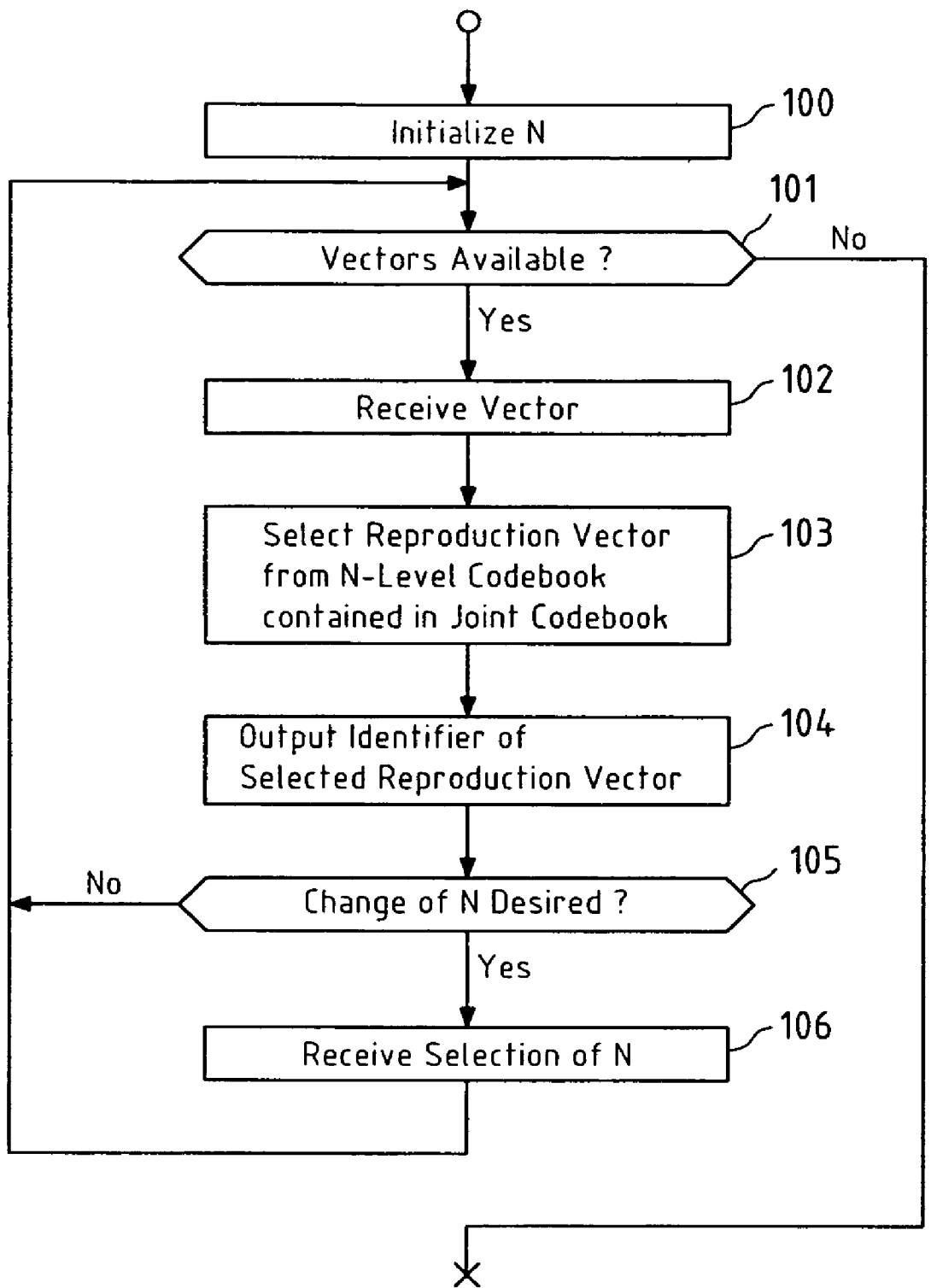
FIG. 2a: a flowchart of an embodiment of a method for N-level quantization of vectors according to the first aspect of the present invention.

FIG. 2a is a flowchart of an embodiment of a method for N level quantization of vectors according to the first aspect of the present invention. This method may for instance be performed by selection and mapping unit 10 of device 1 in the system 4 of FIG. 1. To this end, the steps of this method may be implemented in a software application of a software application product that is executed by a digital processor of said device 1.

In a first step 100, the parameter N is initialized, for instance by receiving a value for N from an external unit. In a step 101, it is then checked if vectors for quantization are available. If this is not the case, the method terminates. Otherwise, one vector is received in a step 102, and in a subsequent step 103, then a reproduction vector is selected from the corresponding N-level codebook, which is represented by the first N reproduction vectors of the joint codebook, so that this reproduction vector minimizes a distortion criterion. In a step 104, then an identifier of said selected reproduction vector is output, for instance to Tx unit 12 of device 1 in FIG. 1.

It is then checked in a step 105 if the parameter N shall be changed, for instance due to external signaling. If this is not the case, the method jumps back to step 101 to quantize further vectors.

Otherwise, a new selection for N is received in step 106, and then only the method jumps back to step 101.

Figure 2B:
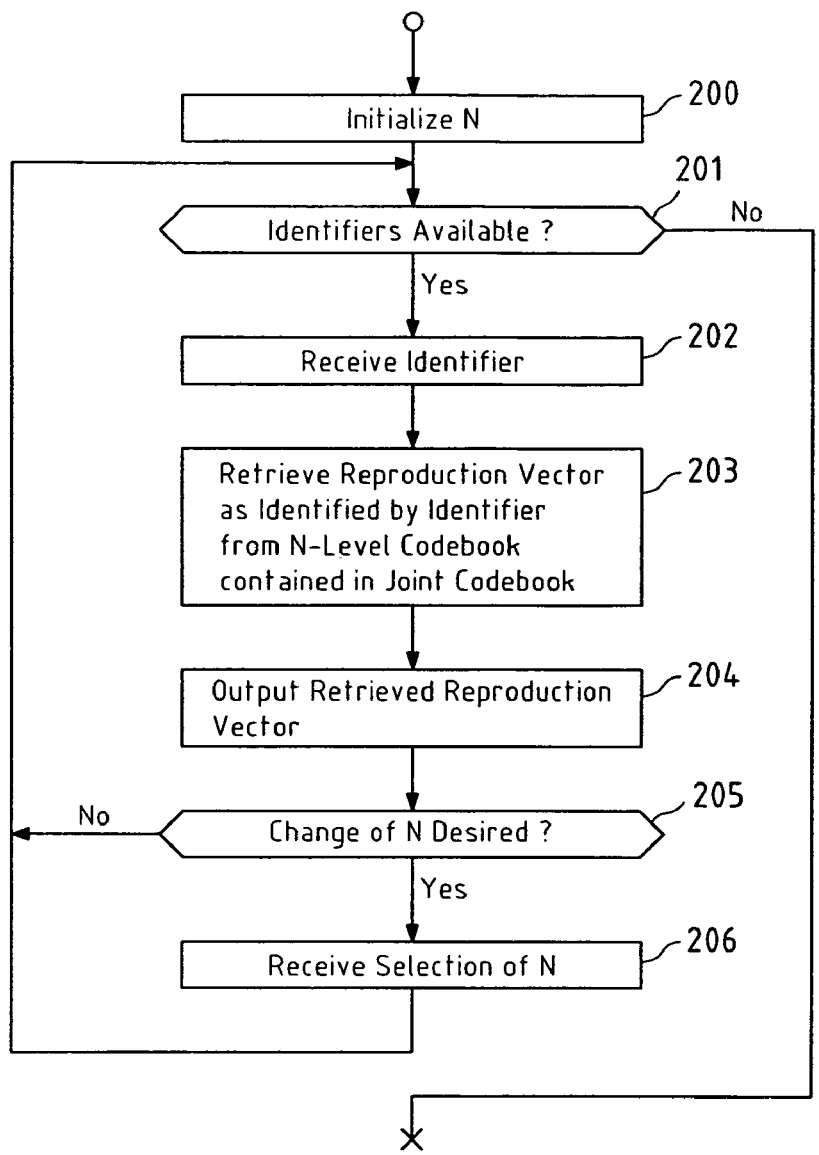
FIG. 2b: a flowchart of an embodiment of a method for retrieving reproduction vectors for vectors that have been N-level quantized according to the second aspect of the present invention.

FIG. 2b is a flowchart of an embodiment of a method for retrieving reproduction vectors for vectors that have been N-level quantized according to the second aspect of the present invention. This method may for instance be performed by unit 20 of device 2 in the system 4 of FIG. 1. To this end, the steps of this method may be implemented in a software application of a software application product that is executed by a digital processor of said device 2.

In a first step 200, the parameter N is initialized, for instance by receiving a value for N from an external instance. N is required to select the proper N-level codebook from the joint codebook. It is then checked in a step 201 if identifiers are available. If this is not the case, the method terminates. Otherwise, one identifier is received in a step 202. In a step 203, then a reproduction vector as identified by said identifier is retrieved from the N-level codebook that is represented by the first N reproduction vectors in said joint codebook. This retrieved reproduction vector then is output a step 204. In a step 205, it is checked if a change of the parameter N is required. If this is not the case, the method jumps back to step 201 to receive further identifiers. Otherwise, a new selection of N is received in a step 206, and the method then only jumps back to step 201.

Figure 3:
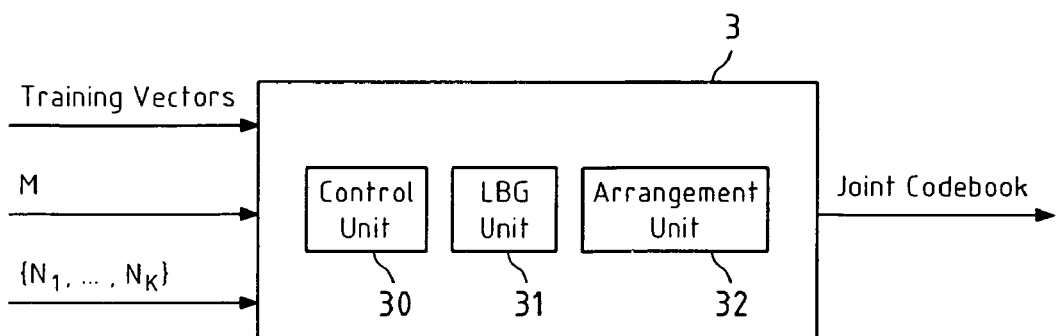
FIG. 3: a schematic presentation of an embodiment of a device for determining a joint codebook for use in an N-level quantization of vectors according to the fourth aspect of the present invention.

FIG. 3 is a schematic presentation of an embodiment of a device 3 for determining a joint codebook for use in an N-level quantization of vectors according to the fourth aspect of the present invention. This device 3 may for instance be deployed for constructing joint codebooks for devices like device 1 or device 2 of the system 4 of FIG. 4. The determined joint codebook then may be stored into memories 11 and 21 of devices 1 and 2, respectively, either during a manufacturing of these devices, or later, for instance via an interface to said memories 11 and 21.

Device 3 comprises a control unit 30, an LBG unit 31 and an arrangement unit 32.

Therein, LBG unit 31 is capable of performing an LBG algorithm to produce a set of L reproduction vectors based on a plurality of training vectors, wherein L is a selectable integer number. Said LBG algorithm may for instance be based on the algorithm for an unknown distribution of the vectors that are to be quantized as proposed in the Linde et al. prior art reference cited in the opening part of this patent specification.

In addition to said plurality of training vectors, said LBG algorithm may be provided with one or more reproduction vectors that shall be considered to be fixed during said generation of said set of L reproduction vectors, as will be explained in more detail with reference to the second embodiment of the method according to the fourth aspect of the present invention with reference to FIG. 4b below. It is readily understood that the use of the LBG algorithm in the embodiments of the present invention is of exemplary nature only. Equally well, other codebook training algorithms may be applied instead.

Arrangement unit 32 is capable of arranging the reproduction vectors produced by the LBG unit 31 in the joint codebook according to an arrangement algorithm, so that for each N, the first N reproduction vectors in the joint codebook form an N-level codebook that allows for a small average distortion of vectors when the N-level codebooks are used in N-level quantizations of these vectors.

Control unit 30 controls the overall operation of device 3 and in particular the interoperation of LBG unit 31 and arrangement unit 32.

For the determination of a joint codebook, device 3 is provided with the maximum number of levels M the joint codebook is to be designed for, and with a plurality of training vectors that are representative of the vectors that shall be later on quantized based on the joint codebook. Optionally, also a pre-defined set of the numbers of levels N for which the joint codebook shall contain N-level codebooks can be provided to device 3. For instance, if M=256, it may be sufficient that the joint codebook only contains codebooks for N=128 and N=256, and then said pre-defined set of the numbers of levels N would be {128,256}. This information may then be exploited by device 3 to determine a codebook optimized for only these two numbers of levels, instead of attempting to determine an optimized codebook for all N=2,4,8,16,32,64, 128,256. Therein, it should be noted that the choice of N being a power of 2 is of exemplary nature only. Said device 3 may equally well be capable of determining joint codebooks for numbers of levels N that are not powers of 2 in order to increase the flexibility of the codebook.

Figure 4A:
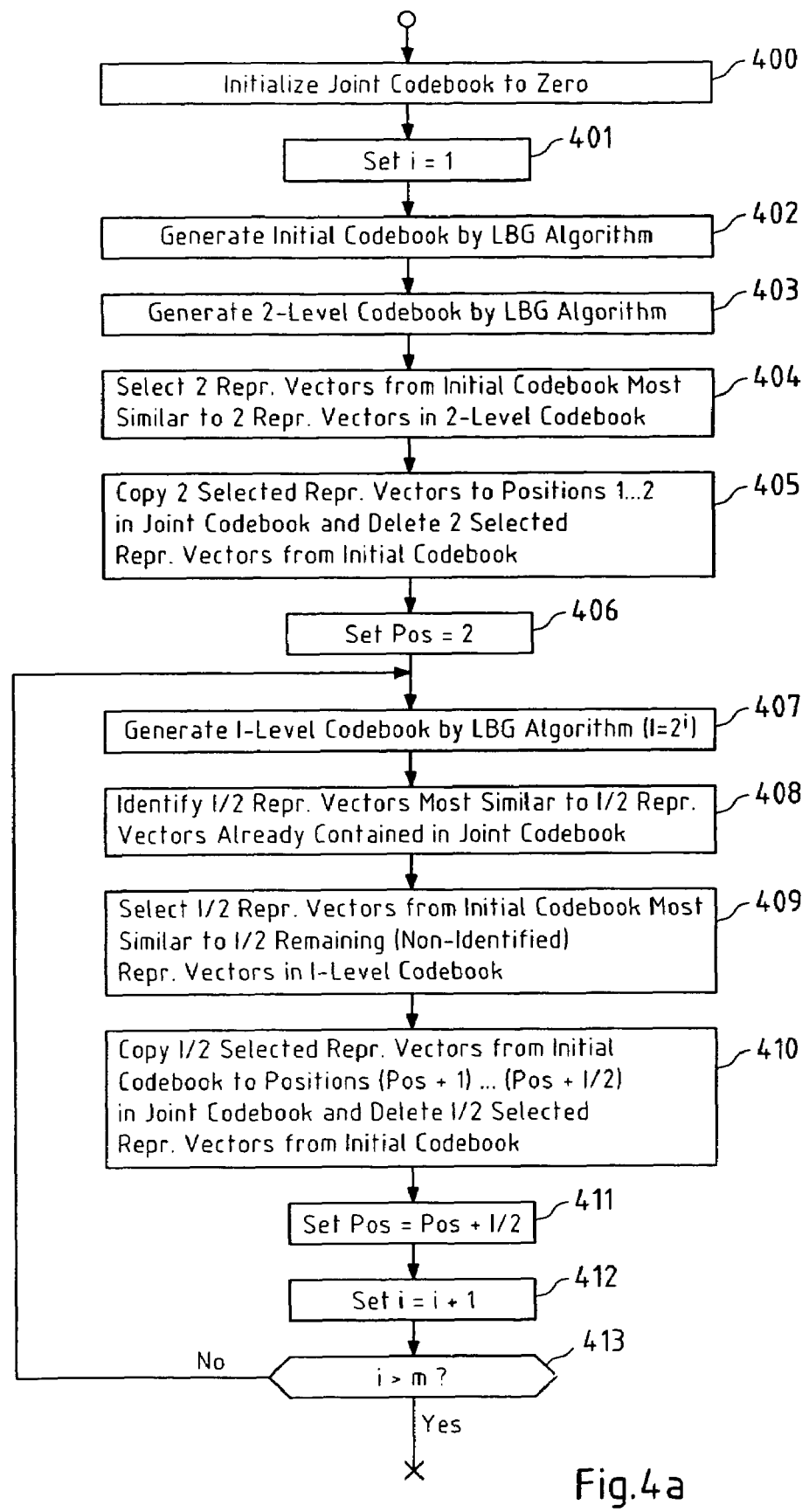
FIG. 4a: a flowchart of a first embodiment of a method for determining a joint codebook for use in an N-level quantization of vectors according to the fourth aspect of the present invention.

FIG. 4a is a flowchart of a first embodiment of a method for determining a joint codebook according to the fourth aspect of the present invention. This first embodiment may for instance be implemented by device 3 of FIG. 3.

In a first step 400, the joint codebook that is to be constructed is initialized as an empty codebook with storage capacity for M reproduction vectors. In a step 401, then a loop counter i is initialized to 1. In a step 402, then a so-called 'initial' M-level codebook is generated according to the LBG algorithm, based on a plurality of training vectors. This may for instance be accomplished by LBG unit 31 of device 3 (see FIG. 3). The remaining steps of the flowchart of FIG. 4a then are directed to arranging the reproduction vectors contained in said initial codebook into said joint codebook initialized in step 400. This arranging may for instance be performed by arrangement unit 32 of device 3 (see FIG. 3).

To this end, in step 403, a 2-level codebook is determined by the LBG algorithm, based on the same training sequence as used in step 402. This may also be performed by LBG unit 31 of device 3 (see FIG. 3). In a step 404, then the two reproduction vectors in said initial codebook that are most similar (in terms of minimizing a distortion criterion) to the two reproduction vectors in said 2-level codebook are identified, and, in a step 405, copied to the first two positions in the joint codebook initialized in step 400. In a step 406, then a position counter Pos is set to 2.

The following steps 407-412 are performed repeatedly until all reproduction vectors from the initial codebook have been arranged into the joint codebook.

In step 407, an I-level codebook is determined based on the LBG algorithm and the same training vectors used in steps 402 and 403, this step being for instance implemented by LBG unit 31 of device 3 (see FIG. 3). Therein, I=$2^i$ holds, with i being the loop counter initialized in step 401. This I-level codebook represents the optimum codebook for N=I. However, since in the joint codebook, the first I/2 reproduction vectors have already been arranged in the flowchart steps performed before, arrangement is only possible for the last I/2 reproduction vectors. Therefore, in a step 408, the I/2 reproduction vectors in said I-level codebook that are determined that are most similar (in terms of minimizing a distortion criterion) to the I/2 reproduction vectors already contained in the joint codebook are identified (and ignored). Then, in step 409, the I/2 reproduction vectors in said initial codebook that are most similar (in terms of minimizing a distortion criterion) to the remaining (non-identified in step 408) reproduction vectors from said I-level codebook are selected and, in a step 410, copied to positions Pos+1 to Pos+I/2 in said joint codebook. In a step 411, the position counter Pos is then increased by I/2, and the loop counter is also increased by 1 in a step 412. In a step 413, it is then checked if the loop counter is larger than m, with m=$\log_2(M)$. If this is the case, all reproduction vectors from the initial codebook have been arranged into the joint codebook, and the method terminates. Otherwise, the method jumps back to step 407 and performs arrangement for the next codebook contained in the joint codebook.

Figure 4B:
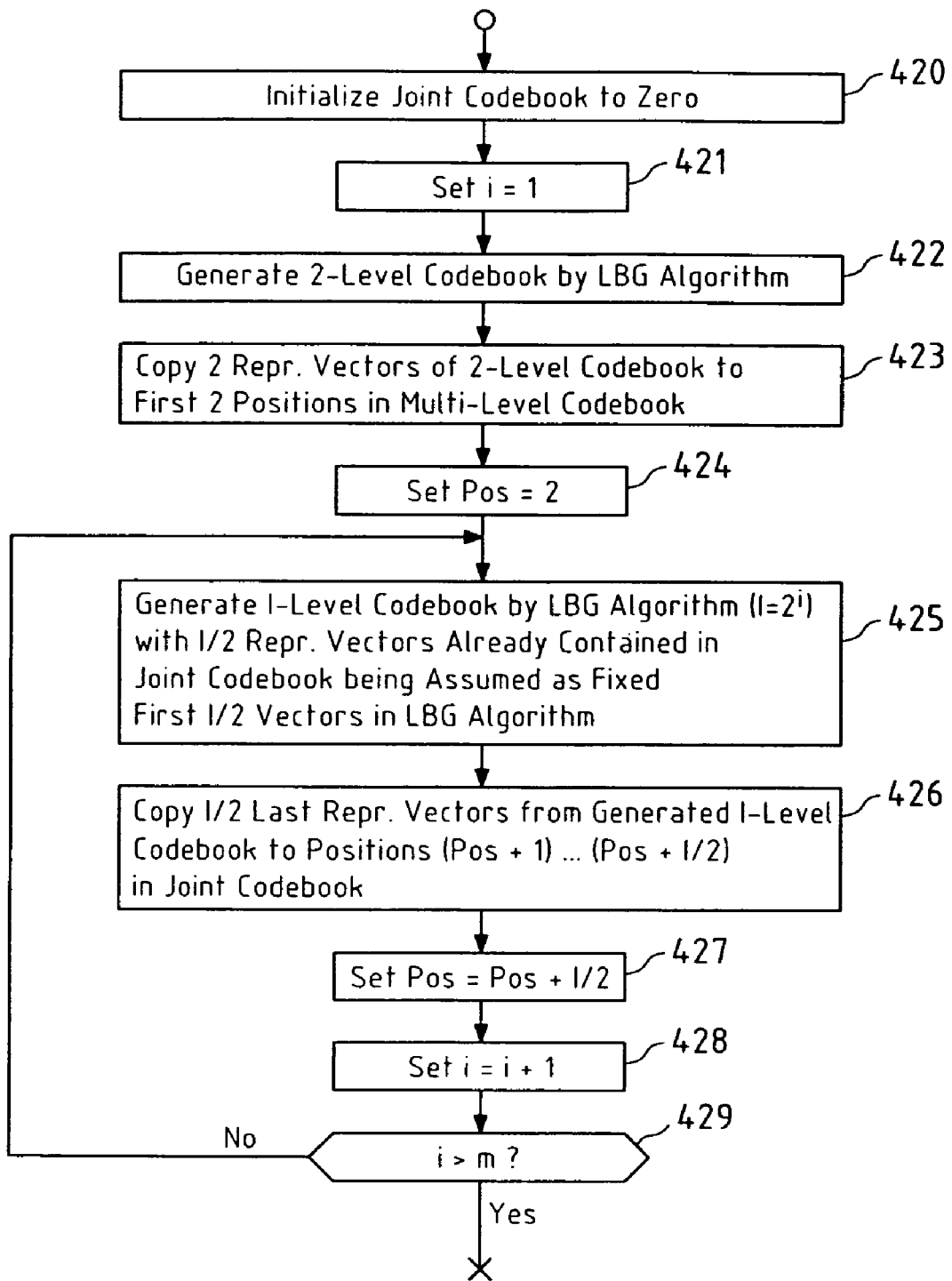
FIG. 4b: a flowchart of a second embodiment of a method for determining a joint codebook for use in an N-level quantization of vectors according to the fourth aspect of the present invention.

FIG. 4b is a flowchart of a second embodiment of a method for determining a joint codebook according to the fourth aspect of the present invention. This second embodiment may for instance be implemented by device 3 of FIG. 3.

In a first step 420, a (target) joint codebook with capacity for M reproduction vectors is initialized. In step 421, a loop counter i is initialized to 1. In step 422, a 2-level codebook is generated by the LBG algorithm, based on a plurality of training vectors. This may for instance be performed by the LBG unit 31 of device 3 of FIG. 3. The two reproduction vectors of this 2-level codebook are copied to the first two positions in the joint codebook in a step 423. In a step 424, a position counter Pos is set to 2. After this preamble operation, which determines and arranges the reproduction vectors of the first codebook (N=2) in the joint codebook, repeatedly steps 425 to 428 are performed in order to generate and determine the next higher-level codebooks.

To this end, in step 425, an I-level codebook is determined by the LBG algorithm based on a plurality of training vectors, wherein I=$2^i$ holds, with i being the loop counter initialized in step 421. Actually, this I-level codebook would represent the optimum codebook for N=I. However, since in the joint codebook, the first I/2 reproduction vectors have already been arranged in the flowchart steps performed before, arrangement is only possible for the last I/2 reproduction vectors. According to the second embodiment of the method according to the fourth aspect of the present invention, this problem is taken care of by initializing the LBG algorithm with a codebook that comprises the first I/2 reproduction vectors that already have been copied to the joint codebook and by demanding that these first I/2 reproduction vectors remain fixed during the operation of the LBG algorithm. This ensures that the I-level codebook output by the LBG algorithm consists of these first I/2 reproduction vectors that are already contained in the joint codebook (and were optimized for lower-level codebooks), and of I/2 reproduction vectors that are optimized for the current I-level codebook, while still considering (and partially compensating) the fact that the first I/2 reproduction vectors in said I-level codebook are fixed. The I/2 last reproduction vectors of the I-level codebook determined in step 425 then can be copied to the positions Pos+1 to Pos +I/2 of the joint codebook in a step 426.

The proper repetition of these steps 425 and 426 is ensured by updating the Position counter Pos in step 427, by increasing the loop counter i in step 428 and by checking it against the value $m=\log_2(M)$ in step 429. If i is larger than m, the method terminates, otherwise, it jumps back to step 425.

Figure 4C:
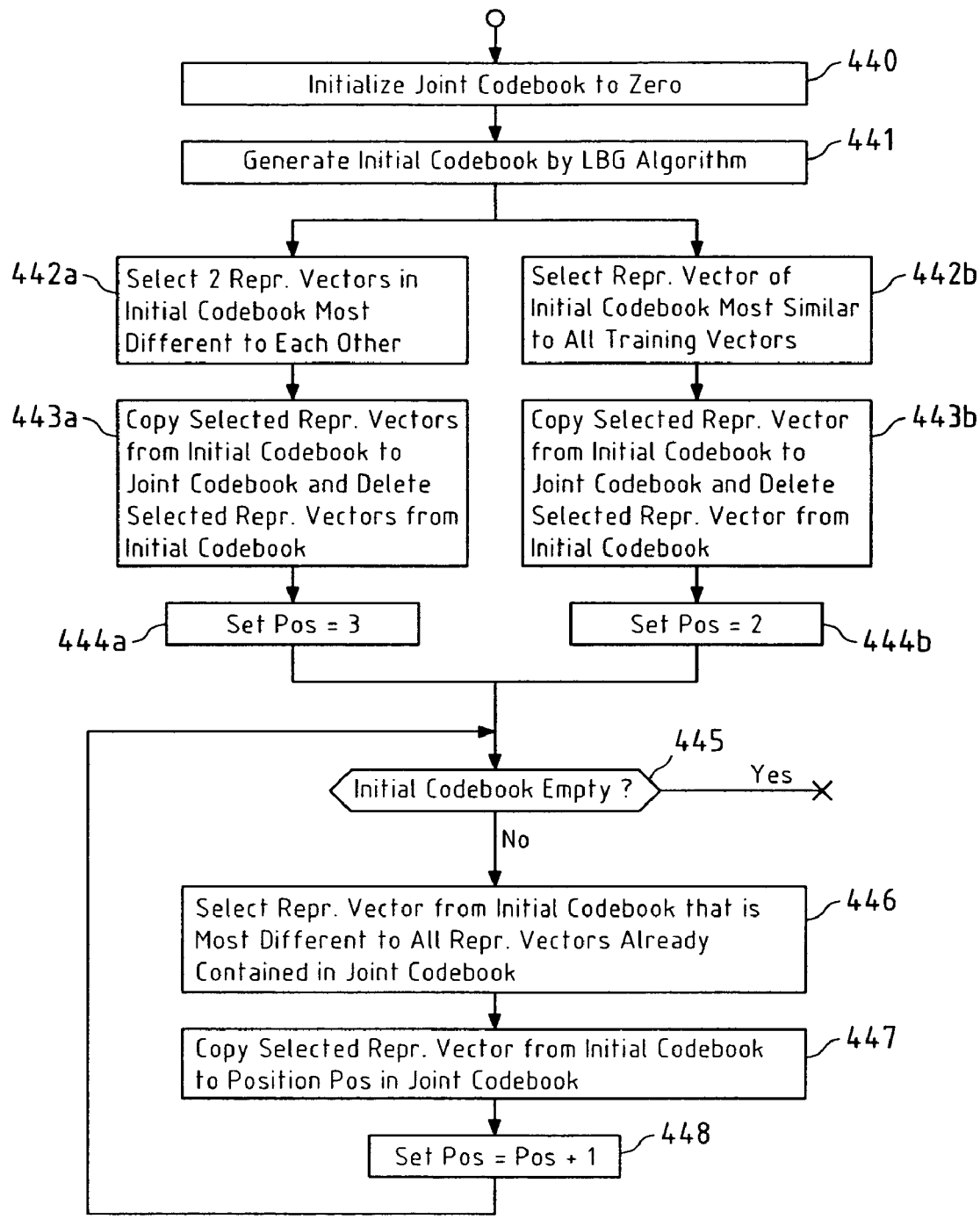
FIG. 4c: a flowchart of a third embodiment of a method for determining a joint codebook for use in an N-level quantization of vectors according to the fourth aspect of the present invention.

FIG. 4c is a flowchart of a third embodiment of a method for determining a joint codebook according to the fourth aspect of the present invention. This third embodiment may for instance be implemented by device 3 of FIG. 3.

In a first step 440, a (target) joint codebook with capacity for M reproduction vectors is initialized. In a second step 441, then a so-called 'initial' M-level codebook is generated according to the LBG algorithm, based on a plurality of training vectors. This may for instance be accomplished by LBG unit 31 of device 3 (see FIG. 3). The remaining steps of the flowchart of FIG. 4c then are directed to arranging the reproduction vectors contained in said initial codebook into said joint codebook initialized in step 440. This arranging may for instance be performed by arrangement unit 32 of device 3 (see FIG. 3).

After step 441, there exist two alternatives to select the first reproduction vector(s) from said initial codebook that is/are copied to the first position(s) in the joint codebook.

According to a first alternative, in a step 442a, the two reproduction vectors that are most different with respect to each other (in terms of maximizing a distortion criterion) are selected from the initial codebook. Then, in a step 443a, the two selected reproduction vectors are copied from the initial codebook to the first two positions in the joint codebook. Furthermore, these reproduction vectors are deleted from the initial codebook. In a step 444a, then a position counter Pos is initialized to 3.

According to a second alternative, in a step 442b, the reproduction vector from the initial codebook that is most similar to all training vectors used in the generation of the initial codebook by the LBG algorithm in step 441 is selected. Then, in a step 443b, the selected reproduction vector is copied from the initial codebook to the first position in the joint codebook. Furthermore, this reproduction vector is deleted from the initial codebook. In a step 444b, then a position counter Pos is initialized to 2.

While the initial codebook is not empty, which is controlled in step 445, the following steps 446 to 448 are repeated (irrespective of the alternative performed before), each time arranging one reproduction vector from said initial codebook into the next free position Pos in said joint codebook.

To this end, in step 446, the reproduction vector in said initial codebook that is most different to all reproduction vectors already contained in said joint codebook is selected. Therein, the reproduction vector most different to all reproduction vectors already contained in said joint codebook may for instance be determined by computing, for each candidate reproduction vector in said initial codebook, the respective distortion with respect to all other reproduction vectors in said initial codebook and summing these distortions to arrive at a single value per candidate reproduction vector. The candidate reproduction vector with the largest sum distortion then can be considered to be most different to all reproduction vectors already contained in said joint codebook. In a step 447, this selected reproduction vector is copied to the (next free) position Pos in the joint codebook, and is deleted form the initial codebook. In step 448, then the position counter Pos is incremented by one, and the method jumps back to step 445.

In this way, the joint codebook is sequentially filled up with reproduction vectors from said initial codebook that are most different to reproduction vectors already contained in said joint codebook, thus ensuring good coverage of the vector space of the vectors that are to be quantized even for low-level codebooks.

To avoid that very rarely used reproduction vectors become the first entries in the joint codebook, further constraints may be imposed on the arranging algorithm reflected by the flowchart of FIG. 4c. For instance, in step 446, the reproduction vector that is most different to all reproduction vectors already contained in said joint codebook, while having all its vector components below a certain limit, may be selected and then copied to the joint codebook in step 447. Said limit may for instance depend on the actual position Pos in the joint codebook for which a reproduction vector is to be selected in the initial codebook. For instance, for the positions corresponding to the 2-level codebook in the joint codebook (positions 1 and 2 in the joint codebook), a first limit may be applied, for the positions corresponding to the second half of the 4-level codebook (positions 3 and 4 in the joint codebook), a second limit may be applied, and so on. Therein, the values of said limits may advantageously increase (i.e. the first limit being smaller than the second limit, which is smaller than a third limit, and so on).

Figure 4D:
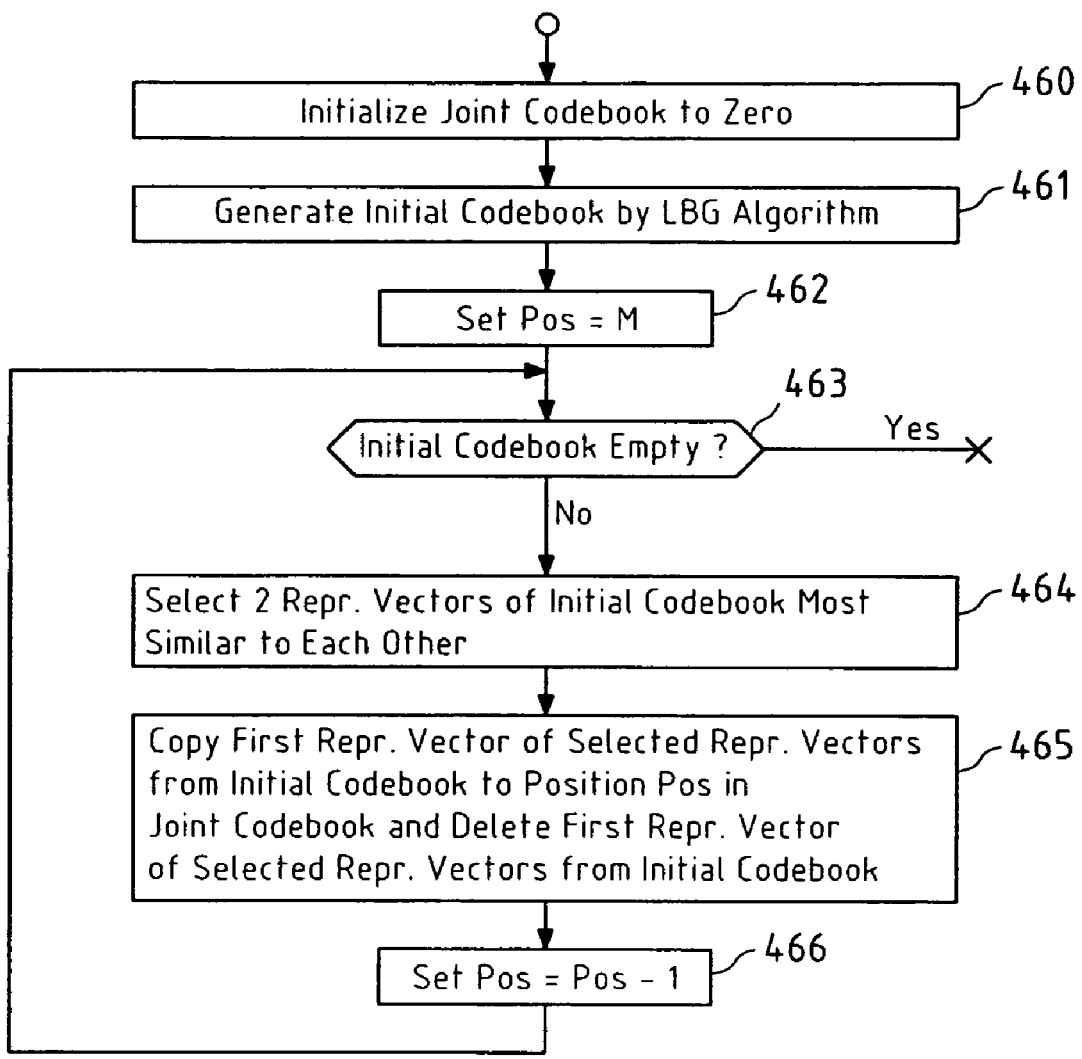
FIG. 4d: a flowchart of a fourth embodiment of a method for determining a joint codebook for use in an N-level quantization of vectors according to the fourth aspect of the present invention.

FIG. 4d is a flowchart of a fourth embodiment of a method for determining a joint codebook according to the fourth aspect of the present invention. This fourth embodiment may for instance be implemented by device 3 of FIG. 3.

In a first step 460, a (target) joint codebook with capacity for M reproduction vectors is initialized. In a second step 461, then a so-called 'initial' M-level codebook is generated according to the LBG algorithm, based on a plurality of training vectors. This may for instance be accomplished by LBG unit 31 of device 3 (see FIG. 3). In a step 462, a position counter Pos is initialized to M. The remaining steps of the flowchart of FIG. 4d then are directed to arranging the reproduction vectors contained in said initial codebook into said joint codebook initialized in step 460. This arranging may for instance be performed by arrangement unit 32 of device 3 (see FIG. 3).

While the initial codebook is not empty, which is controlled in step 463, the following steps 464 to 466 are repeated, each time arranging one reproduction vector from said initial codebook into the next free position Pos in said joint codebook, but now starting from the end of the joint codebook and proceeding to the beginning.

To this end, in step 464, the two reproduction vectors in said initial codebook that are most similar (in terms of minimizing a distortion criterion) to each other are selected. In a step 465, the first of these two selected reproduction vectors is copied to the (next free) position Pos in the joint codebook, and is deleted form the initial codebook. In step 466, then the position counter Pos is decremented by one, and the method jumps back to step 463.

In this way, the joint codebook is sequentially filled up from the end with reproduction vectors from said initial codebook that are similar to other reproduction vectors in said initial codebook. This ensures good coverage of the vector space of the vectors that are to be quantized even for low-level codebooks, for the reproduction vectors for these low-level codebooks are positioned at the beginning of the joint codebook.

Figure 4E:
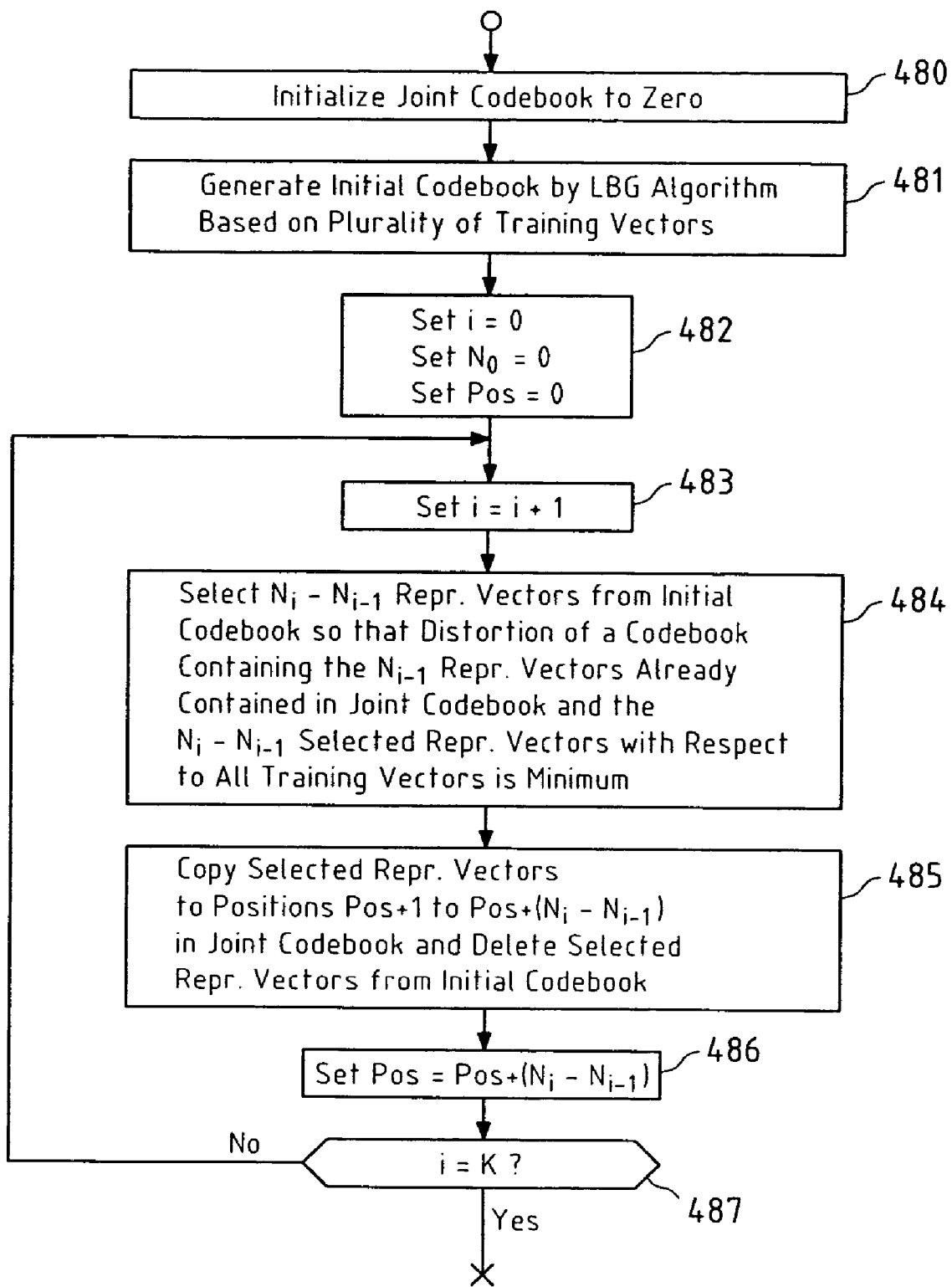
FIG. 4e: a flowchart of a fifth embodiment of a method for determining a joint codebook for use in an N-level quantization of vectors according to the fourth aspect of the present invention.

FIG. 4e is a flowchart of a fifth embodiment of a method for determining a joint codebook according to the fourth aspect of the present invention. This fifth embodiment may for instance be implemented by device 3 of FIG. 3.

In a first step 480, a (target) joint codebook with capacity for M reproduction vectors is initialized. In a second step 481, then a so-called 'initial' M-level codebook is generated according to the LBG algorithm, based on a plurality of training vectors. This may for instance be accomplished by LBG unit 31 of device 3 (see FIG. 3). The remaining steps of the flowchart of FIG. 4e then are directed to arranging the reproduction vectors contained in said initial codebook into said joint codebook initialized in step 480. This arranging may for instance be performed by arrangement unit 32 of device 3 (see FIG. 3).

In a step 482, a counter i is initialized to zero. Furthermore, a variable $N_0$ is defined to be zero. Finally, a position counter Pos is initialized to zero.

Step 483 to 487 describe a loop that is repeated K times. Therein, K denotes the number of codebook sizes $N_i$ (with i=1, ..., K and $N_{j-1} < N_j \leq M$ with j=2, ..., K) that shall be provided by the joint codebook. In each loop i, a codebook of size $N_i$ is completed as will be described below.

In step 484 of the loop, $N_i - N_{i-1}$ reproduction vectors are selected from the initial codebook, copied to the next free positions in the joint codebook and deleted from the initial codebook. The selection of these reproduction vectors is performed so that a distortion of a $N_i$-level codebook that contains the $N_i$ reproduction vectors that have already been copied to the joint codebook in previous loops and said selected reproduction vectors with respect to the training vectors used in the LBG algorithm (see step 481) is minimum. For i=1 (and, correspondingly, $N_i = N_0 = 0$), no reproduction vectors have been copied to the joint codebook so far, and thus the selection of the reproduction vectors is performed so that a distortion of the $N_1$-level codebook that only contains the selected reproduction vectors with respect to the training vectors used in the LBG algorithm is minimum.

Therein, the distortion of the codebook may for instance be determined by calculating the sum distortion of each reproduction vector contained in the $N_i$-level codebook with respect to all training vectors from the Voronoi cell of the considered reproduction vector and summing the sum distortions of all reproduction vectors in said codebook to arrive at a final value. Therein, the distortion is for instance determined by means of the Euclidean distance between vectors, or the distance derived from the $l_1$ norm, to name but a few.

In step 485 of the loop, the selected reproduction vectors are copied to positions Pos+1 to Pos+$N_i - N_{i-1}$ in the joint codebook (which are the next free positions in the joint codebook), and the selected reproduction vectors are deleted from the initial codebook, so that they do not have to be considered in the selection of reproduction vectors in the next loop. As can be seen, only the last $N_i - N_{i-1}$ positions of the respective $N_i$-level codebook are determined in each loop i, because the first $N_{i-1}$ positions have already been determined in previous loops. The $N_i$-level codebook is thus said to be "completed" (and not entirely determined) in loop i.

In a step 486, the position counter Pos is accordingly increased by $N_i - N_{i-1}$. In a step 487, it is then checked if all K codebooks to be contained in the joint codebook have already been processed (i=K). If this is the case, the method terminates. Otherwise (i<K), the method jumps back to step 483 to complete the next codebook.

As an example, if M=4, $N_1$=2 and $N_2$=4 holds, in a first loop i=1, $N_1$=2 reproduction vectors from the initial codebook are selected so that the distortion of the 2-element codebook that contains these 2 reproduction vectors with respect to the training vectors is minimum. These 2 reproduction vectors are copied to positions 1 and 2 in the joint codebook (so that the 2-element codebook contained at the beginning of the joint codebook is completed) and are deleted from the initial codebook. In a next loop i=2, $N_2 - N_1$=2 reproduction vectors are selected, so that the codebook with the 2 reproduction vectors already contained in the joint codebook and the 2 selected reproduction vectors has minimum distortion with respect to the training vectors. The 2 reproduction vectors are then copied to positions 3 and 4 in the joint codebook (so that the 4-element codebook contained at the beginning of the joint codebook is completed) and deleted form the initial codebook. Therein, it is readily understood that the choice of M and the $N_i$ is not necessarily restricted to be a power of two.

The invention has been described above by means of exemplary embodiments. It should be noted that there are alternative ways and variations which are obvious to a skilled person in the art and can be implemented without deviating from the scope and spirit of the appended claims. In particular, the present invention is not limited to application in the context of speech or audio processing. It may equally well be deployed for the quantization of any other type of data.

The invention claimed is:

1. A method comprising:
    selecting, in an N-level quantization of a vector, wherein N is selectable prior to said quantization from a set of at least two pre-defined values that are smaller than or equal to a pre-defined maximum number of levels M, a reproduction vector for said vector from an N-level codebook of N reproduction vectors that are, for each N in said set of at least two pre-defined values, represented by the first N reproduction vectors of the same joint codebook of M reproduction vectors, and
    providing an identifier signal that identifies said selected reproduction vector, said method further comprising processing said identifier signal for storage in a storage medium or for transmission on a transmission channel of a communication system.

2. The method according to claim 1, wherein $N=2^n$ and $M=2^m$ holds, with n and m being integer values.

3. The method according to claim 2, wherein each reproduction vector in said N-level codebook is identified by an n-bit binary word.

4. The method according to claim 1, wherein said vectors comprise parameters related to Linear Predictive Coding of an data sequence.

5. The method according to claim 1, wherein said selecting is performed by a portable communication device.

6. An apparatus comprising:
    means for selecting, in an N-level quantization of a vector, wherein N is selectable prior to said quantization from a set of at least two pre-defined values that are smaller than or equal to a pre-defined maximum number of levels M, a reproduction vector for said vector from an N-level codebook of N reproduction vectors that are, for each N in said set of at least two pre-defined values, represented by the first N reproduction vectors of the same joint codebook of M reproduction vectors and for providing an identifier signal that identifies said selected reproduction vector; and
    means for processing said identifier signal for storage in a storage medium or for transmission on a transmission channel of a communication system.

7. A computer-readable medium having a computer program stored thereon, the computer program comprising:
    instructions operable to cause a processor to select, in an N-level quantization of a vector, wherein N is selectable prior to said quantization from a set of at least two pre-defined values that are smaller than or equal to a pre-defined maximum number of levels M, a reproduction vector for said vector from an N-level codebook of N reproduction vectors that are, for each N in said set of at least two pre-defined values, represented by the first N reproduction vectors of the same joint codebook of M reproduction vectors and to provide an identifier signal that identifies said reproduction vector for further processing for storage in a storage medium or for transmission on a transmission channel of a communication system.

8. A method comprising:
receiving an identifier signal from a storage medium or over a communication channel, said identifier signal indicative of a reproduction vector that has been selected for a vector in an N-level quantization of said vector, wherein N is selectable prior to said quantization of said vector from a set of at least two pre-defined values that are smaller than or equal to a pre-defined maximum number of levels M; and
retrieving, based on said identifier, said reproduction vector from an N-level codebook of N reproduction vectors that are, for each N in said set of at least two pre-defined values, represented by the first N reproduction vectors of the same joint codebook of M reproduction vectors said retrieved reproduction vector for output to further processing stages.

9. The method according to claim 8, wherein $N=2^n$ and $M=2^m$ holds, with n and m being integer values.

10. An apparatus comprising:
means for receiving an identifier signal from a storage medium or over a communication channel, said identifier signal indicative of a reproduction vector that has been selected for a vector in an N-level quantization of said vector, wherein N is selectable prior to said quantization of said vector from a set of at least two pre-defined values that are smaller than or equal to a pre-defined maximum number of levels M; and
means for retrieving, based on said identifier, said reproduction vector from an N-level codebook of N reproduction vectors that are, for each N in said set of at least two pre-defined values, represented by the first N reproduction vectors of the same joint codebook of M reproduction vectors said retrieved reproduction vector for output to further processing stages.

11. A computer-readable medium having a computer program stored thereon, said computer program comprising:
instructions operable to cause a processor to receive an identifier signal from a storage medium or over a communication channel, said identifier signal indicative of a reproduction vector that has been selected for a vector in an N-level quantization of said vector, wherein N is selectable prior to said quantization of said vector from a set of at least two pre-defined values that are smaller than or equal to a pre-defined maximum number of levels M; and
instructions operable to cause a processor to retrieve, based on said identifier, said reproduction vector from an N-level codebook of N reproduction vectors that are, for each N in said set of at least two pre-defined values, represented by the first N reproduction vectors of the same joint codebook of M reproduction vectors said retrieved reproduction vector for output to further processing stages.

12. A system, comprising:
means for selecting a reproduction vector for a vector from an N-level codebook of N reproduction vectors, wherein N is selectable prior to said selecting from a set of at least two pre-defined values that are smaller than or equal to a pre-defined maximum number of levels M, and wherein said N reproduction vectors are, for each N in said set of at least two pre-defined values, represented by the first N reproduction vectors of a first joint codebook of M reproduction vectors;
means for transmitting an identifier of said selected reproduction vector via a transmission channel;
means for receiving said identifier; and
means for retrieving, based on said identifier, said reproduction vector from an N-level codebook of N reproduction vectors represented by the first N reproduction vectors of a second joint codebook of M reproduction vectors that equals said first codebook.

13. A method comprising:
generating reproduction vectors for a joint codebook of M reproduction vectors for us in an N-level quantization of vectors by a training algorithm at least partially based on a plurality of training vectors, wherein M is a pre-defined maximum number of levels, wherein N is selectable prior to said quantization from a set of at least two pre-defined values that are smaller than or equal to M, and wherein in said quantization, a reproduction vector for each vector is selected from an N-level codebook of N reproduction vectors that are, for each N in said set of at least two pre-defined values, represented by the first N reproduction vectors of said joint codebook; and
storing and arranging said generated reproduction vectors in a memory according to an arrangement algorithm so as to form said joint codebook in such a way that for each N, the first N reproduction vectors in said joint codebook form an N-level codebook that allows for a small average distortion of said vectors when used in said quantization of said vectors.

14. The method according to claim 13, wherein $N=2^n$ and $M=2^m$ holds, with n and m being integer values.

15. The method according to claim 14, comprising:
generating an initial codebook of M reproduction vectors by said training algorithm;
generating a 2-level codebook of 2 reproduction vectors by said training algorithm;
selecting those 2 reproduction vectors from said initial codebook that are most similar to said 2 reproduction vectors in said 2-level codebook;
copying said 2 selected reproduction vectors from said initial codebook to the first 2 positions in said joint codebook and deleting said 2 selected reproduction vectors from said initial codebook; and
repeating, for $1<i \leq m$, the following:
generating an I-level codebook of $I=2^i$ reproduction vectors by said training algorithm;
identifying those I/2 reproduction vectors from said I-level codebook that are most similar to said I/2 reproduction vectors already copied to said joint codebook;
for the remaining non-identified I/2 reproduction vectors in said I-level codebook, selecting those I/2 reproduction vectors from said initial codebook that are most similar to said remaining non-identified I/2 reproduction vectors; and
copying said I/2 selected reproduction vectors from said initial codebook to the next free positions in increasing sense in said joint codebook and deleting said I/2 selected reproduction vectors from said initial codebook.

16. The method according to claim 14, comprising: generating a 2-level codebook of 2 reproduction vectors by said training algorithm;
- copying said 2 reproduction vectors from said 2-level codebook to the first 2 positions in said joint codebook; and
- repeating, for $1 < i \leq m$, the following:
  - generating an I-level codebook of $I=2^i$ reproduction vectors by said training algorithm, wherein in said training algorithm, the I/2 reproduction vectors already copied to said joint codebook form the first part of a codebook of I reproduction vectors, which serves as an initialization of said I-level codebook generated by said training algorithm, and are assumed fixed throughout said training algorithm; and
  - copying the I/2 last reproduction vectors of said generated I-level codebook to the next free I/2 positions in increasing sense in said joint codebook.

17. The method according to claim 13, comprising:
- generating an initial codebook of M reproduction vectors by said training algorithm based on a plurality of training vectors;
- selecting, from said initial codebook, the two reproduction vectors that are most different to each other;
- copying said two selected reproduction vectors from said initial codebook to the first two positions in said joint codebook and deleting said two selected reproduction vectors from said initial codebook; and
- repeating, while said initial codebook is non-empty, the following:
  - selecting the reproduction vector from said initial codebook that is most different with respect to all reproduction vectors already copied to said joint codebook;
  - copying said selected reproduction vector from said initial codebook to the next free position in increasing sense in said joint codebook and deleting said selected reproduction vector from said initial codebook.

18. The method according to claim 13, comprising:
- generating an initial codebook of M reproduction vectors by said training algorithm based on a plurality of training vectors;
- selecting, from said initial codebook, the reproduction vector that is most similar to all of said training vectors;
- copying said selected reproduction vector from said initial codebook to the first position in said joint codebook and deleting said selected reproduction vector from said initial codebook; and
- repeating, while said initial codebook is non-empty, the following:
  - selecting the reproduction vector from said initial codebook that is most different with respect to all reproduction vectors already copied to said joint codebook;
  - copying said selected reproduction vector from said initial codebook to the next free position in increasing sense in said joint codebook and deleting said selected reproduction vector from said initial codebook.

19. The method according to claim 13, comprising:
- generating an initial codebook of M reproduction vectors by said training algorithm;
- repeating, while said initial codebook is non-empty, the following:
  - selecting those 2 reproduction vectors from said initial codebook that are most similar to each other;
  - copying the first of said two selected reproduction vectors from said initial codebook to the next free position, in decreasing sense starting from the last position, in said joint codebook and deleting said first of said two selected reproduction vectors from said initial codebook.

20. The method according to claim 13, wherein said set of at least two pre-defined values for N that are smaller than or equal to M contains K values $N_i$ with $i=1, \ldots, K$ and $N_{j-1} < N_j \leq M$ for $j=2, \ldots, K$, said method comprising:
- generating an initial codebook of M reproduction vectors by said training algorithm based on a plurality of training vectors;
- selecting, from said initial codebook, $N_1$ reproduction vectors so that a distortion of a codebook that contains said selected reproduction vectors with respect to all of said training vectors is minimum;
- copying said selected reproduction vectors from said initial codebook to said joint codebook and deleting said selected reproduction vectors from said initial codebook; and
- repeating, for each $N_i$ with $1 < i \leq K$, the following:
  - selecting, from said initial codebook, $N_i - N_{i-1}$ reproduction vectors so that a distortion of a codebook that contains the $N_{i-1}$ reproduction vectors already copied to said joint codebook and said selected reproduction vectors with respect to all of said training vectors is minimum; and
  - copying said selected reproduction vectors from said initial codebook to the next free positions in increasing sense in said joint codebook and deleting said selected reproduction vectors from said initial codebook.

21. An apparatus comprising:
- means for generating reproduction vectors for a joint codebook of M reproduction vectors for use in an N-level quantization of vectors by a training algorithm at least partially based on a plurality of training vectors, wherein M is a pre-defined maximum number of levels, wherein N is selectable prior to said quantization from a set of at least two pre-defined values that are smaller than or equal to M, and wherein in said quantization, a reproduction vector for each vector is selected from an N-level codebook of N reproduction vectors that are, for each N in said set of at least two pre-defined values, represented by the first N reproduction vectors of said joint codebook; and
- means for storing and arranging said generated reproduction vectors in a memory according to an arrangement algorithm so as to form said joint codebook in such a way that for each N, the first N reproduction vectors in said set of M reproduction vectors form an N-level codebook that allows for a small average distortion of said vectors when used in said quantization of said vectors.

22. A computer-readable medium having a computer program stored thereon, the computer program comprising:
- instructions operable to cause a processor to generate reproduction vectors for a joint codebook of M reproduction vectors for use in an N-level quantization of vectors by a training algorithm at least partially based on a plurality of training vectors, wherein M is a pre-defined maximum number of levels, wherein N is selectable prior to said quantization from a set of at least two pre-defined values that are smaller than or equal to M, and wherein in said quantization, a reproduction vector for each vector is selected from an N-level codebook of N reproduction vectors that are, for each N in said set of at least two pre-defined values, represented by the first N reproduction vectors of said joint codebook; and instructions operable to cause a processor to store and arrange said generated reproduction vectors in a memory according to an arrangement algorithm so as to form said joint codebook in such a way that for each N, the first N reproduction vectors in said set of M reproduction vectors form an N-level codebook that allows for a small average distortion of said vectors when used in said quantization of said vectors.

23. An apparatus comprising:
a selector configured to select, in an N-level quantization of a vector, wherein N is selectable prior to said quantization from a set of at least two pre-defined values that are smaller than or equal to a pre-defined maximum number of levels M, a reproduction vector for said vector from an N-level codebook of N reproduction vectors that are, for each N in said set of at least two pre-defined values, represented by the first N reproduction vectors of the same joint codebook of M reproduction vectors and configured to provide an identifier signal that identifies said selected reproduction vector; and
a processor for processing said identifier signal for storage in a storage medium or for transmission via a transmission channel of a communication system.

24. The apparatus according to claim 23, wherein $N=2^n$ and $M=2^m$ holds, with n and m being integer values.

25. The apparatus according to claim 24, wherein each reproduction vector in said N-level codebook is identified by an n-bit binary word.

26. The apparatus according to claim 23, wherein said vectors comprise parameters related to Linear Predictive Coding of a data sequence.

27. The apparatus according to claim 23, wherein said selecting is performed by a portable communication device.

28. The apparatus according to claim 23, wherein said apparatus is a portable communication device.

29. An apparatus comprising:
a receiver configured to receive an identifier signal from a storage medium or over a communication channel, said identifier signal indicative of a reproduction vector that has been selected for a vector in an N-level quantization of said vector, wherein N is selectable prior to said quantization of said vector from a set of at least two pre-defined values that are smaller than or equal to a pre-defined maximum number of levels M; and
a retriever configured to retrieve, based on said identifier, said reproduction vector from an N-level codebook of N reproduction vectors that are, for each N in said set of at least two pre-defined values, represented by the first N reproduction vectors of the same joint codebook of M reproduction vectors, said retrieved reproduction vector for output to further processing stages.

30. The apparatus according to claim 29, wherein said apparatus is a portable communication device.

31. A system comprising:
a selector configured to select a reproduction vector for a vector from an N-level codebook of N reproduction vectors, wherein N is selectable prior to said selecting from a set of at least two pre-defined values that are smaller than or equal to a pre-defined maximum number of levels M, and wherein said N reproduction vectors are, for each N in said set of at least two pre-defined values, represented by the first N reproduction vectors of a first joint codebook of M reproduction vectors and configured to provide an identifier signal that identifies said selected reproduction vector;
a transmitter configured to process said identifier signal and configured to transmit said identifier signal via a transmission channel;
a receiver configured to receive said identifier signal; and
a retriever configured to retrieve, based on said identifier, said reproduction vector from an N-level codebook of N reproduction vectors represented by the first N reproduction vectors of a second joint codebook of M reproduction vectors that equals said first codebook for output to further processing stages.

32. An apparatus comprising:
a generator configured to generate reproduction vectors for a joint codebook of M reproduction vectors for use in an N-level quantization of vectors by a training algorithm at least partially based on a plurality of training vectors, wherein M is a pre-defined maximum number of levels, wherein N is selectable prior to said quantization from a set of at least two pre-defined values that are smaller than or equal to M, and wherein in said quantization, a reproduction vector for each vector is selected from an N-level codebook of N reproduction vectors that are, for each N in said set of at least two pre-defined values, represented by the first N reproduction vectors of said joint codebook; and
a storage and an arranger configured to arrange said generated reproduction vectors in a memory according to an arrangement algorithm so as to form said joint codebook in such a way that for each N, the first N reproduction vectors in said set of M reproduction vectors form an N-level codebook that allows for a small average distortion of said vectors when used in said quantization of said vectors.

33. The apparatus according to claim 29, wherein $N=2^n$ and $M=2^m$ holds, with n and m being integer values.

34. The apparatus according to claim 32, wherein $N=2^n$ and $M=2^m$ holds, with n and m being integer values.

35. The apparatus according to claim 34, wherein said apparatus is configured to generate an initial codebook of M reproduction vectors by said training algorithm; wherein said apparatus is configured to generate a 2-level codebook of 2 reproduction vectors by said training algorithm; wherein said apparatus is configured to select those 2 reproduction vectors from said initial codebook that are most similar to said 2 reproduction vectors in said 2-level codebook; wherein said apparatus is configured to copy said 2 selected reproduction vectors from said initial codebook to the first 2 positions in said joint codebook and to delete said 2 selected reproduction vectors from said initial codebook; and wherein said apparatus is configured to repeat, for $1 < i \leq m$, the following:
generating an I-level codebook of $I=2^i$ reproduction vectors by said training algorithm;
identifying those I/2 reproduction vectors from said I-level codebook that are most similar to said I/2 reproduction vectors already copied to said joint codebook;
for the remaining non-identified I/2 reproduction vectors in said I-level codebook, selecting those I/2 reproduction vectors from said initial codebook that are most similar to said remaining non-identified I/2 reproduction vectors; and
copying said I/2 selected reproduction vectors from said initial codebook to the next free positions in increasing sense in said joint codebook and deleting said I/2 selected reproduction vectors from said initial codebook.

36. The apparatus according to claim 34, wherein said apparatus is configured to generate a 2-level codebook of 2 reproduction vectors by said training algorithm; wherein said apparatus is configured to copy said 2 reproduction vectors from said 2-level codebook to the first 2 positions in said joint codebook; and wherein said apparatus is configured to repeat, for $1<i\leq m$, the following:

generating an I-level codebook of $I=2^i$ reproduction vectors by said training algorithm, wherein in said training algorithm, the I/2 reproduction vectors already copied to said joint codebook form the first part of a codebook of I reproduction vectors, which serves as an initialization of said I-level codebook generated by said training algorithm, and are assumed fixed throughout said training algorithm; and copying the I/2 last reproduction vectors of said generated I-level codebook to the next free I/2 positions in increasing sense in said joint codebook.

37. The apparatus according to claim 32, wherein said apparatus is configured to generate an initial codebook of M reproduction vectors by said training algorithm based on a plurality of training vectors; wherein said apparatus is configured to select, from said initial codebook, the two reproduction vectors that are most different to each other; wherein said apparatus is configured to copy said two selected reproduction vectors from said initial codebook to the first two positions in said joint codebook and deleting said two selected reproduction vectors from said initial codebook; and wherein said apparatus is configured to repeat, while said initial codebook is non-empty, the following:

selecting the reproduction vector from said initial codebook that is most different with respect to all reproduction vectors already copied to said joint codebook;

copying said selected reproduction vector from said initial codebook to the next free position in increasing sense in said joint codebook and deleting said selected reproduction vector from said initial codebook.

38. The apparatus according to claim 32, wherein said apparatus is configured to generate an initial codebook of M reproduction vectors by said training algorithm based on a plurality of training vectors; wherein said apparatus is configured to select, from said initial codebook, the reproduction vector that is most similar to all of said training vectors; wherein said apparatus is configured to copy said selected reproduction vector from said initial codebook to the first position in said joint codebook and deleting said selected reproduction vector from said initial codebook; and wherein said apparatus is configured to repeat, while said initial codebook is non-empty, the following:

selecting the reproduction vector from said initial codebook that is most different with respect to all reproduction vectors already copied to said joint codebook;

copying said selected reproduction vector from said initial codebook to the next free position in increasing sense in said joint codebook and deleting said selected reproduction vector from said initial codebook.

39. The apparatus according to claim 32, wherein said apparatus is configured to generate an initial codebook of M reproduction vectors by said training algorithm; wherein said apparatus is configured to repeat, while said initial codebook is non-empty, the following:

selecting those 2 reproduction vectors from said initial codebook that are most similar to each other;

copying the first of said two selected reproduction vectors from said initial codebook to the next free position, in decreasing sense starting from the last position, in said joint codebook and deleting said first of said two selected reproduction vectors from said initial codebook.

40. The apparatus according to claim 32, wherein said set of at least two pre-defined values for N that are smaller than or equal to M contains K values $N_i$ with $i=1, \ldots, K$ and $N_{j-1}<N_j\leq M$ for $j=2, \ldots, K$, wherein said apparatus is configured to generate an initial codebook of M reproduction vectors by said training algorithm based on a plurality of training vectors; wherein said apparatus is configured to select, from said initial codebook, $N_1$ reproduction vectors so that a distortion of a codebook that contains said selected reproduction vectors with respect to all of said training vectors is minimum; wherein said apparatus is configured to copy said selected reproduction vectors from said initial codebook to said joint codebook and to delete said selected reproduction vectors from said initial codebook; and wherein said apparatus is configured to repeat, for each $N_i$ with $1<i\leq K$, the following:

selecting, from said initial codebook, $N_i-N_{i-1}$ reproduction vectors so that a distortion of a codebook that contains the $N_{i-1}$ reproduction vectors already copied to said joint codebook and said selected reproduction vectors with respect to all of said training vectors is minimum; and copying said selected reproduction vectors from said initial codebook to the next free positions in increasing sense in said joint codebook and deleting said selected reproduction vectors from said initial codebook.

41. The method according to claim 9, wherein each reproduction vector in said N-level codebook is identified by an n-bit binary word.

42. The apparatus according to claim 33, wherein each reproduction vector in said N-level codebook is identified by an n-bit binary word.

* * * * *

UNITED STATES PATENT AND TRADEMARK OFFICE
CERTIFICATE OF CORRECTION

PATENT NO.        : 7,587,314 B2
APPLICATION NO.   : 11/214484
DATED             : September 8, 2009
INVENTOR(S)       : Adriana Vasilache et al.

Page 1 of 1

It is certified that error appears in the above-identified patent and that said Letters Patent is hereby corrected as shown below:

In column 26, line 18 (claim 13, line 3), "us" should be --use--.

Signed and Sealed this

First Day of December, 2009

David J. Kappos
*Director of the United States Patent and Trademark Office*

UNITED STATES PATENT AND TRADEMARK OFFICE
CERTIFICATE OF CORRECTION

PATENT NO.       : 7,587,314 B2
APPLICATION NO.  : 11/214484
DATED            : September 8, 2009
INVENTOR(S)      : Vasilache et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 898 days.

Signed and Sealed this

Twenty-first Day of September, 2010

David J. Kappos
*Director of the United States Patent and Trademark Office*